US011211130B2

(12) United States Patent
Hirashima et al.

(10) Patent No.: US 11,211,130 B2
(45) Date of Patent: Dec. 28, 2021

(54) SEMICONDUCTOR DEVICE

(71) Applicant: KIOXIA CORPORATION, Tokyo (JP)

(72) Inventors: Yasuhiro Hirashima, Kawasaki Kanagawa (JP); Masaru Koyanagi, Ota Tokyo (JP); Mikihiko Ito, Ota Tokyo (JP); Kei Shiraishi, Kawasaki Kanagawa (JP); Fumiya Watanabe, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/867,263

(22) Filed: May 5, 2020

(65) Prior Publication Data

US 2020/0265902 A1 Aug. 20, 2020

Related U.S. Application Data

(63) Continuation of application No. 16/120,294, filed on Sep. 2, 2018, now Pat. No. 10,679,710.

(30) Foreign Application Priority Data

Mar. 22, 2018 (JP) .............................. JP2018-054330

(51) Int. Cl.
*G11C 16/28* (2006.01)
*G11C 16/04* (2006.01)
*G11C 16/30* (2006.01)
*G11C 7/10* (2006.01)
*G11C 16/10* (2006.01)

(52) U.S. Cl.
CPC .............. *G11C 16/28* (2013.01); *G11C 7/109* (2013.01); *G11C 16/0483* (2013.01); *G11C 16/10* (2013.01); *G11C 16/30* (2013.01)

(58) Field of Classification Search
None
See application file for complete search history.

(56) References Cited

U.S. PATENT DOCUMENTS

| | | | |
|---|---|---|---|
| 6,333,875 B1 * | 12/2001 | Shinozaki | G11C 7/1066 365/193 |
| 6,803,792 B2 | 10/2004 | Yasuda et al. | |
| 6,933,759 B1 | 8/2005 | Wu et al. | |
| 8,644,085 B2 | 2/2014 | Kim et al. | |
| 8,879,335 B2 | 11/2014 | Koyanagi et al. | |
| 2003/0031081 A1 | 2/2003 | Suzuki et al. | |
| 2012/0250423 A1 * | 10/2012 | Koyanagi | H03K 19/017527 365/189.05 |

* cited by examiner

*Primary Examiner* — James G Norman
(74) *Attorney, Agent, or Firm* — Kim & Stewart LLP

(57) ABSTRACT

A semiconductor device comprises an input circuit that includes a first comparator configured to output a first output signal and a second output signal having a phase opposite to that of the first output signal, based on a comparison result of a first input signal and a second input signal which is a complementary signal of the first input signal. A duty ratio of the first output signal and a duty ratio of the second output signal are different from a duty ratio of the first input signal and a duty ratio of the second input signal, respectively.

11 Claims, 27 Drawing Sheets

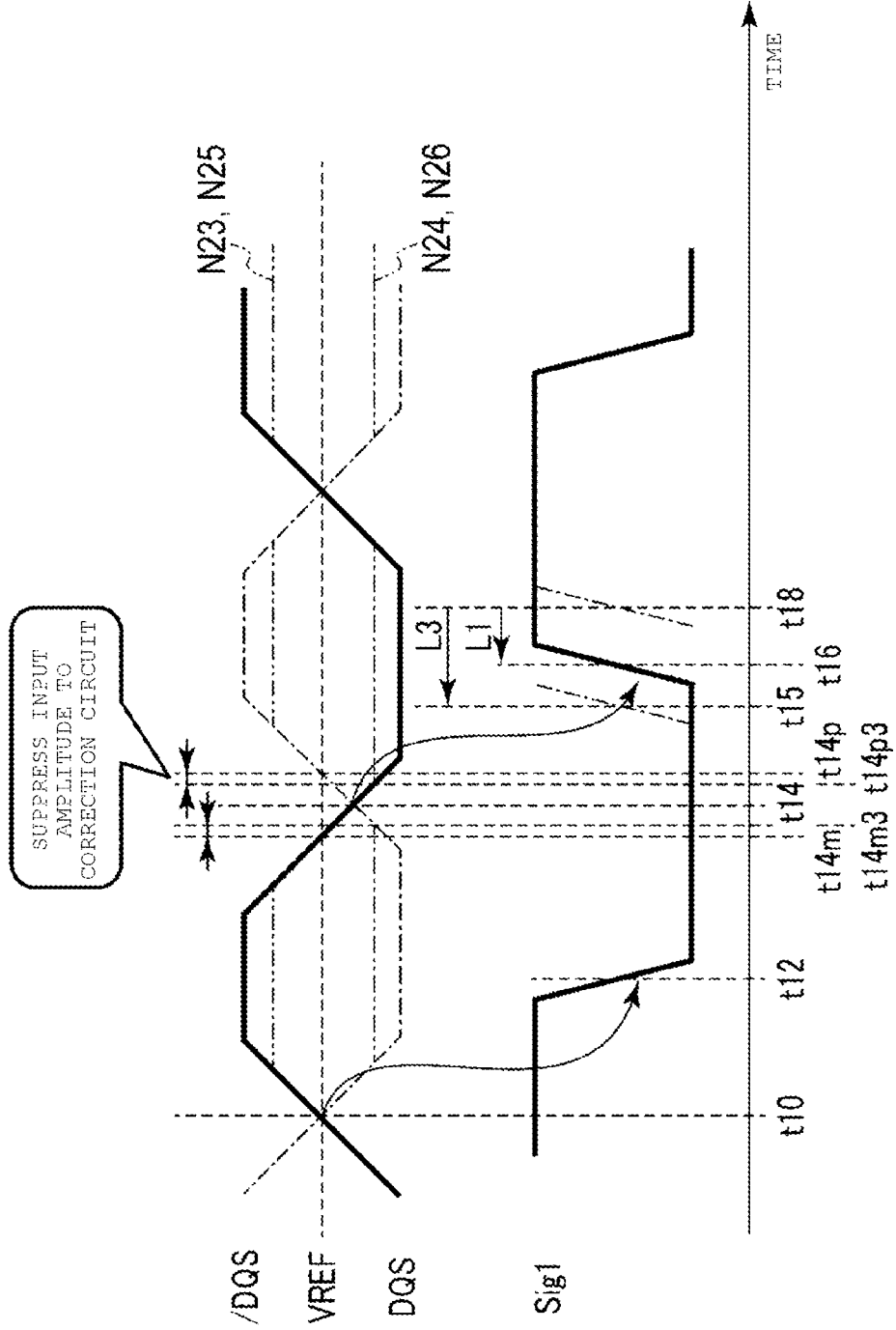

SEMICONDUCTOR DEVICE

CROSS-REFERENCE TO RELATED APPLICATIONS

This application is a continuation of U.S. patent application Ser. No. 16/120,294, filed Sep. 2, 2018, which is based upon and claims the benefit of priority from Japanese Patent Application No. 2018-054330, filed Mar. 22, 2018, the entire contents of which are incorporated herein by reference.

FIELD

Embodiments described herein relate generally to a semiconductor device.

BACKGROUND

A NAND flash memory as a semiconductor device is known.

DESCRIPTION OF THE DRAWINGS

FIG. 27 is a timing chart for explaining an input operation in the semiconductor memory device according to the eighth embodiment.

DETAILED DESCRIPTION

Figure 1:
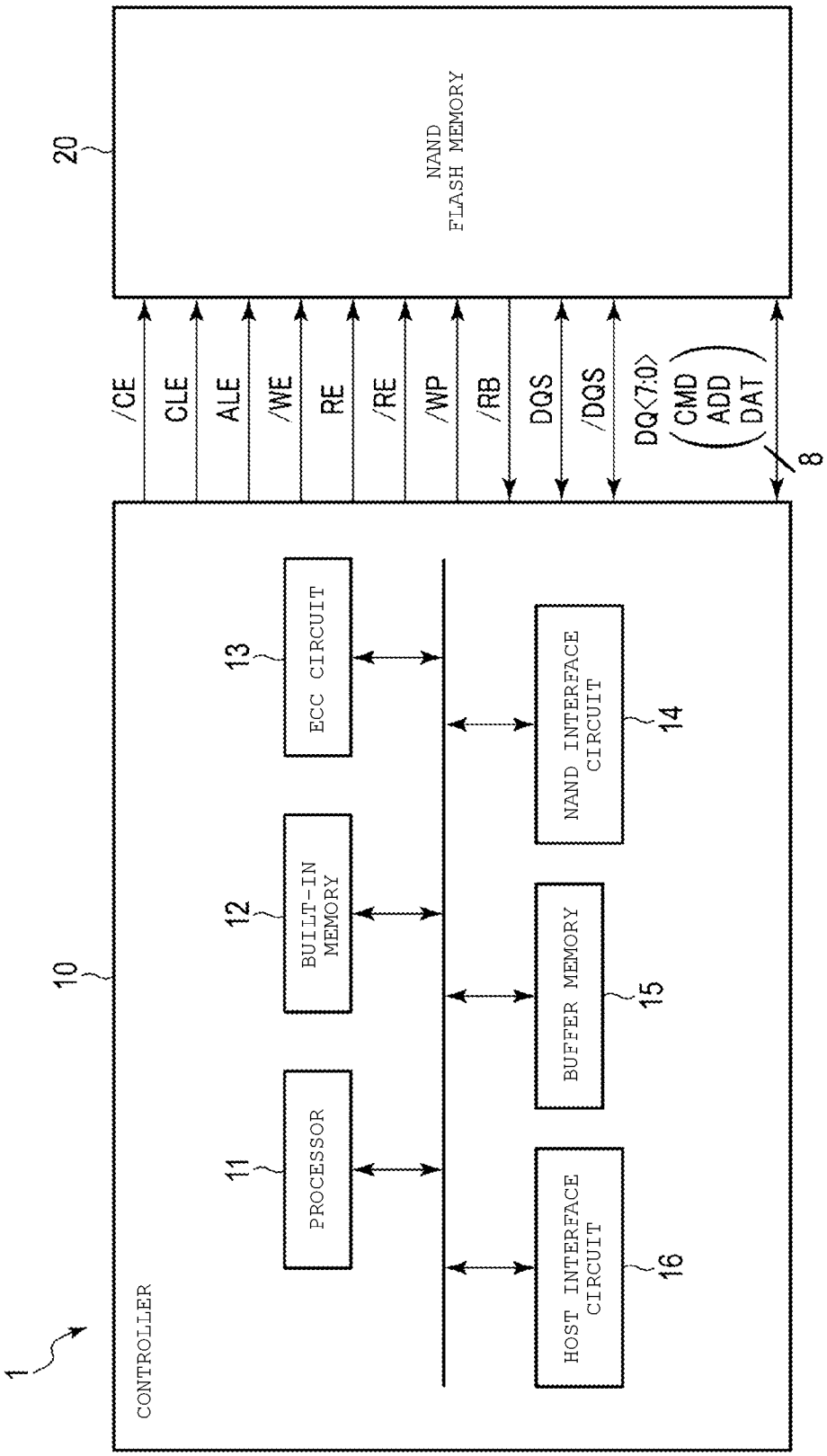
FIG. 1 is a block diagram of a memory system according to a first embodiment.

Embodiments provide a semiconductor device that improves the characteristics of an input signal.

In general, according to one embodiment, there is provided a semiconductor device comprising an input circuit that includes a first comparator configured to output a first output signal and a second output signal having a phase opposite to that of the first output signal, based on a comparison result of a first input signal and a second input signal which is a complementary signal of the first input signal. A duty ratio of the first output signal and a duty ratio of the second output signal are different from a duty ratio of the first input signal and a duty ratio of the second input signal, respectively.

Hereinafter, embodiments will be described with reference to the drawings. In the following description, elements having the same functions and configurations are denoted by the same reference numerals.

In the following description, a signal X<n:0> (n is a natural number) is a (n+1)-bit signal and means a set of signals X<0>, X<1>, . . . , and X<n>, each of which is a 1-bit signal. Also, element Y<n:0> means a set of constituent elements Y<0>, Y<1>, . . . , and Y<n> that correspond to an input or output of the signal X<n:0> in a one-to-one relationship.

In the following description, a signal /Z indicates that it is a complementary signal of a signal Z. A "duty ratio of the signals Z and /Z" represents the ratio of the time from rising of a pulse to falling of the pulse with respect to one cycle of the pulse in the signals Z and /Z.

1. First Embodiment

A memory system according to a first embodiment will be described. The memory system according to the first embodiment includes, for example, a NAND flash memory as a semiconductor memory device and a memory controller for controlling the NAND flash memory.

1.1 Configuration

1.1.1 Overall Configuration of Memory System

First, a configuration example of a memory system according to the first embodiment will be described with reference to FIG. 1. FIG. 1 is a block diagram illustrating an example of the configuration of the memory system according to the first embodiment. A memory system 1 communicates with, for example, an external host apparatus (not illustrated). The memory system 1 stores data from a host apparatus (not illustrated) and reads data for a host apparatus.

As illustrated in FIG. 1, the memory system 1 includes a controller 10 and a semiconductor memory device (e.g., NAND flash memory) 20. The controller 10 receives an instruction from the host apparatus and controls the semiconductor memory device 20 based on the received instruction. Specifically, the controller 10 writes data instructed to be written by the host apparatus to the semiconductor memory device 20, reads data instructed to be read by the host apparatus from the semiconductor memory device 20, and transmits the data to the host apparatus. The controller 10 is connected to the semiconductor memory device 20 via a NAND bus. The semiconductor memory device 20 includes a plurality of memory cells and stores data in a nonvolatile manner.

The NAND bus transmits and receives signals /CE, CLE, ALE, /WE, /RE, /WP, /RB, DQS, /DQS, and DQ<7:0> according to a NAND interface standard via individual signal lines. The signal /CE is a signal for enabling the semiconductor memory device 20. The signal CLE notifies the semiconductor memory device 20 that the signal DQ<7:0> transmitted to the semiconductor memory device 20 is a command while the signal CLE is in the "H (High)" level. The signal ALE notifies the semiconductor memory device 20 that the signal DQ<7:0> transmitted to the semiconductor memory device 20 is an address while the signal ALE is in the "H" level. The signal /WE instructs the semiconductor memory device 20 to capture the signal DQ<7:0> output by the semiconductor memory device 20 while the signal /WE is in the "L (Low)" level. The signals RE and /RE are complementary signals and instruct the semiconductor memory device 20 to output the signal DQ<7:0>. The signal /WP instructs the semiconductor memory device 20 to prohibit data writing and erasing. The signal /RB indicates whether the semiconductor memory device 20 is in a ready state (a state in which reception of an instruction from the outside is allowed) or a busy state (a state in which reception of an instruction from the outside is not allowed). The signals DQS and /DQS are complementary signals and are used as strobe signals for controlling the operation timing of the semiconductor memory device 20 according to the signal DQ<7:0>. The signal DQ<7:0> is, for example, an 8-bit signal. The signal DQ<7:0> contains data transmitted and received between the semiconductor memory device 20 and the controller 10, and includes a command CMD, an address ADD, and a data DAT. The data DAT includes write data and read data.

1.1.2 Configuration of Controller

Subsequently, a controller of the memory system according to the first embodiment will be described with continued reference to FIG. 1. The controller 10 includes a processor (CPU: Central Processing Unit) 11, a built-in memory (RAM: Random Access Memory) 12, an error check and correction (ECC) circuit 13, a NAND interface circuit 14, a buffer memory 15, and a host interface circuit 16.

A processor 11 controls the overall operation of the controller 10. The processor 11 issues a read instruction based on the NAND interface to the semiconductor memory device 20, for example, in response to a data read instruction received from the host apparatus. This operation also applies to a case of writing and erasing of data. The processor 11 has a function of executing various operations on read data from the semiconductor memory device 20.

A built-in memory 12 is, for example, a semiconductor memory such as a dynamic RAM (DRAM) and is used as a work area of the processor 11. The built-in memory 12 stores firmware for managing the semiconductor memory device 20, various management tables, and the like.

An ECC circuit 13 performs error detection and error correction processing. More specifically, when data is written, an ECC code is generated for each set of a certain number of pieces of data based on data received from the host apparatus. When data is read out, ECC decoding is performed based on the ECC code to detect the presence or absence of an error. When an error is detected, a bit position at which the error is detected is specified and the error is corrected.

The NAND interface circuit 14 is connected to the semiconductor memory device 20 via the NAND bus, and is responsible for communication with the semiconductor memory device 20. Under the instruction of the processor 11, the NAND interface circuit 14 transmits the command CMD, the address ADD, and write data to the semiconductor memory device 20. The NAND interface circuit 14 receives read data from the semiconductor memory device 20.

The buffer memory 15 temporarily stores data and the like received by the controller 10 from the semiconductor memory device 20 and the host apparatus. The buffer memory is also used, for example, as a memory area for temporarily storing read data from the semiconductor memory device 20, an operation result on the read data, and the like.

The host interface circuit 16 is connected to the host apparatus and is responsible for the communication with the host apparatus. The host interface circuit 16 transfers, for example, an instruction and data received from the host apparatus to the processor 11 and the buffer memory 15, respectively.

1.1.3 Configuration of Semiconductor Memory Device

Next, a configuration example of the semiconductor memory device according to the first embodiment will be described with reference to FIG. 2.

Figure 2:
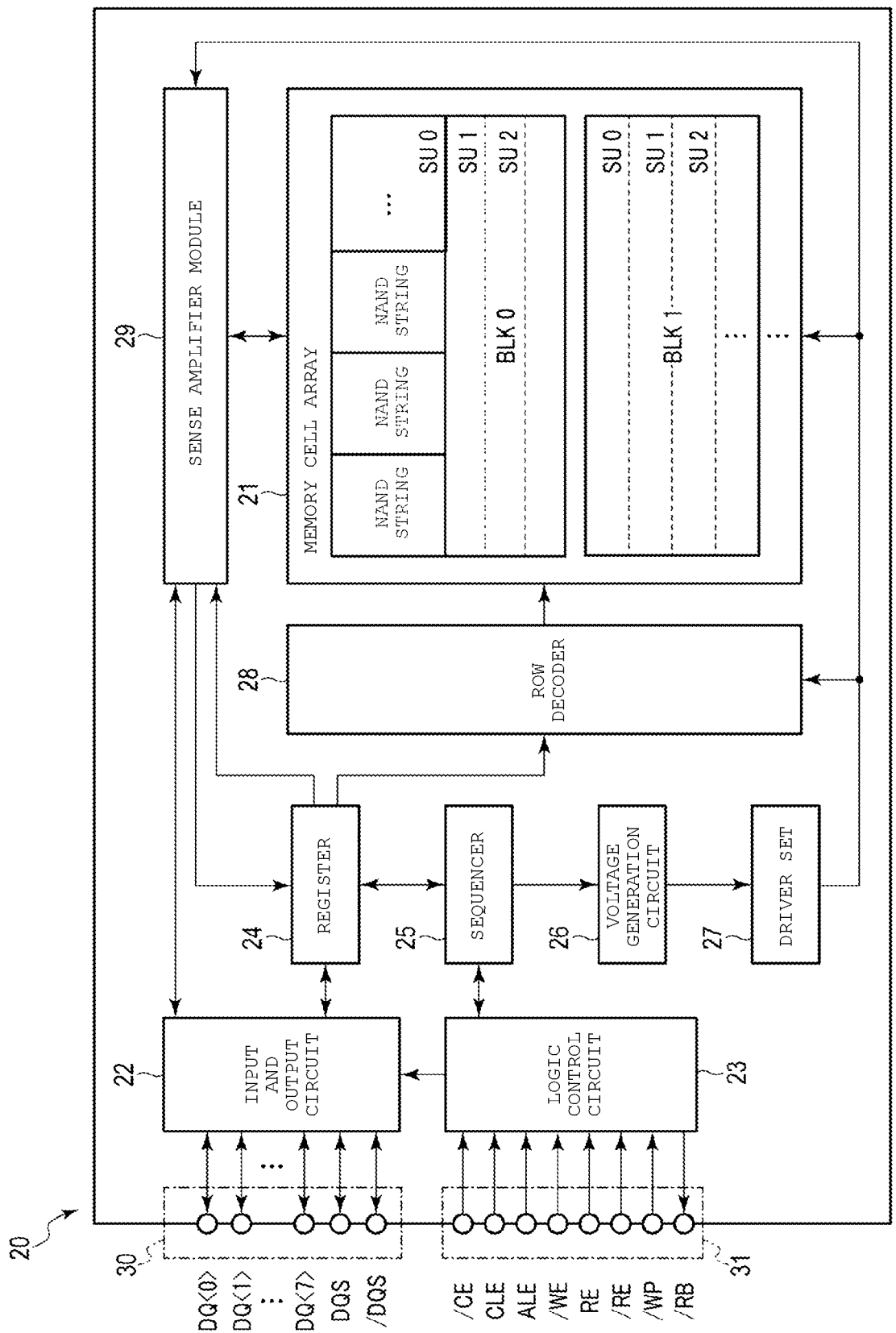
FIG. 2 is a block diagram of a semiconductor memory device according to the first embodiment.

As illustrated in FIG. 2, the semiconductor memory device 20 includes a memory cell array 21, an input and output circuit 22, a logic control circuit 23, a register 24, a sequencer 25, a voltage generation circuit 26, a driver set 27, a row decoder 28, a sense amplifier 29, an input and output pad group 30, and a logic control pad group 31.

The memory cell array 21 includes a plurality of non-volatile memory cells (not illustrated) associated with word lines and bit lines.

The input and output circuit 22 transmits and receives the signal DQ<7:0> and the signals DQS and /DQS to and from the controller 10. The input and output circuit 22 determines a command and address in the signal DQ<7:0> based on the signals DQS and /DQS, and transfers the command and address to the register 24. The input and output circuit 22 determines write data and read data based on the signals DQS and /DQS, and transmits and receives the write data and read data to and from the sense amplifier 29.

The logic control circuit 23 receives the signals /CE, CLE, ALE, /WE, /RE, and /WP from the controller 10. The logic control circuit 23 transfers the signal /RB to the controller 10 and notifies a state of the semiconductor memory device 20 to the outside.

The register 24 stores the command and the address. The register 24 transfers the address to the row decoder 28 and the sense amplifier 29 and transfers the command to the sequencer 25.

The sequencer 25 receives the command and controls the entire semiconductor memory device 20 according to a sequence based on the received command.

The voltage generation circuit 26 generates a voltage necessary for operations such as writing, reading, and erasing of data based on an instruction from the sequencer 25. The voltage generation circuit 26 supplies the generated voltage to the driver set 27.

The driver set 27 includes a plurality of drivers and supplies various voltages from the voltage generation circuit 26 to the row decoder 28 and the sense amplifier 29 based on address from the register 24. The driver set 27 supplies various voltages to the row decoder 28, for example, based on a row address in the address.

The row decoder 28 receives the row address in the address from the register 24 and selects a memory cell in a row based on the row address. The voltage from the driver set 27 is transferred to the memory cell of the selected row via the row decoder 28.

When data is read, the sense amplifier 29 senses read data which is read from the memory cell to the bit line, and transfers the sensed read data to the input and output circuit 22. The sense amplifier 29 transfers write data to be written via the bit lines to the memory cell transistor at the time of writing data. The sense amplifier 29 receives a column address in the address from the register 24, and outputs column data based on the column address.

The input and output pad group 30 transfers the signal DQ<7:0> and the signals DQS and /DQS received from the controller 10 to the input and output circuit 22. The input and output pad group 30 transfers the signal DQ<7:0> transmitted from the input and output circuit 22 to the outside of the semiconductor memory device 20.

The logic control pad group 31 transfers the signals /CE, CLE, ALE, /WE, RE, /RE, and /WP received from the controller 10 to the logic control circuit 23. The logic control pad group 31 transfers the /RB signal transmitted from the logic control circuit 23 to the outside of the semiconductor memory device 5.

1.1.4 Configuration of Input and Output Circuit

Next, a configuration of an input and output circuit of the semiconductor memory device according to the first embodiment will be described.

1.1.4.1 Functional Configuration of Input and Output Circuit

Figure 3:
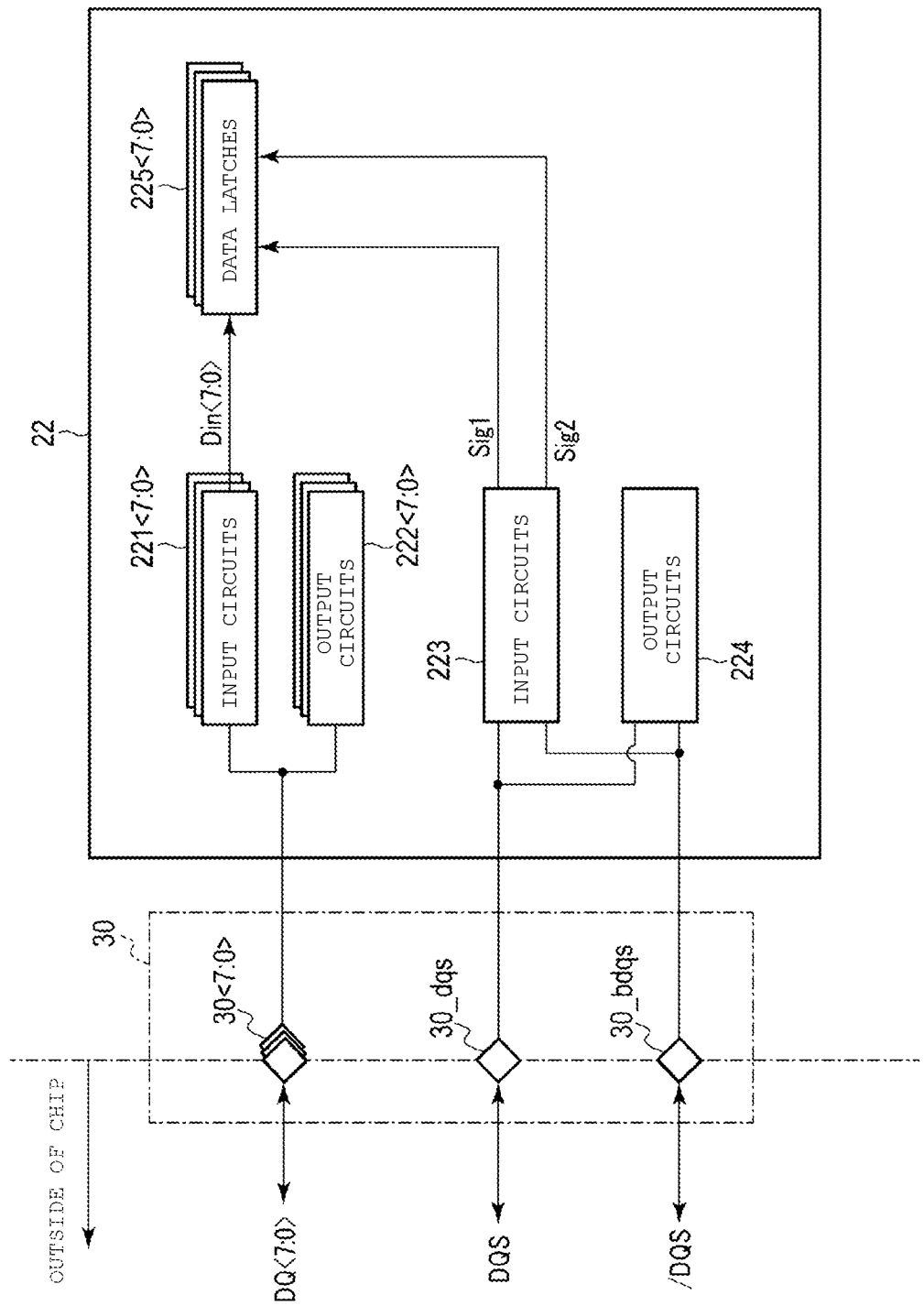
FIG. 3 is a block diagram of an input and output circuit of the semiconductor memory device according to the first embodiment.

A functional configuration of the input and output circuit of the semiconductor memory device according to the first embodiment will be described with reference to FIG. 3. FIG. 3 is a block diagram for explaining the functional configuration of the input and output circuit of the semiconductor memory device according to the first embodiment.

As illustrated in FIG. 3, the input and output circuit includes input circuits 221<7:0>, output circuits 222<7:0>, an input circuit 223, an output circuit 224, data latches 225<7:0>.

For example, the same type of signal DQ<k> (0≤k≤7) is assigned to a set including one input circuit 221<k> and one output circuit 222<k>. That is, the set including the input circuit 221<k> and the output circuit 222<k> can communicate the signal DQ<k> with the external controller 10 via a pad 30<k> in the input and output pad group 30. When the signal DQ<k> is received, the input circuit 221<k> generates a signal Din<k> and sends the signal Din<k> to a corresponding data latch 225<k>.

The set including the input circuit 223 and the output circuit 224 can communicate the signals DQS and /DQS with the external controller 10 via a pad 30 dqs in the input and output pad group 30. When the signals DQS and /DQS are received, the input circuit 223 generates signals Sig1 and Sig2 and sends the signals Sig1 and Sig2 to the data latches 225<7:0>.

The data latches 225<7:0> receive the signals Din<7:0> from the corresponding input circuits 221<7:0>, respectively, and latch data contained in the signal DQ<7:0> based on the signals Sig1 and Sig2 when the signals Sig1 and Sig2 are received from the input circuit 223.

1.1.4.2 Configuration of Input Circuit and Data Latch

Figure 4:
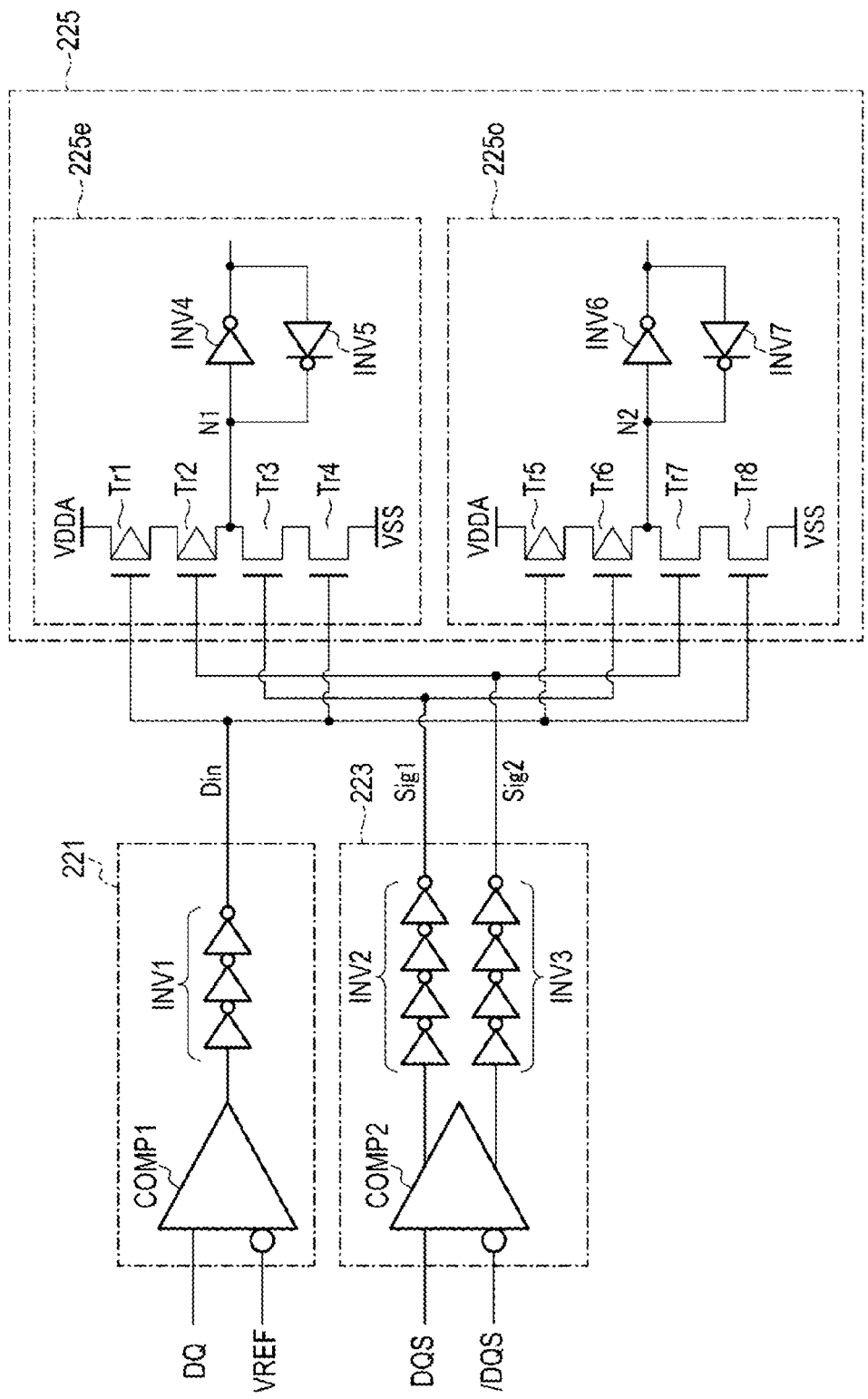
FIG. 4 is a circuit diagram of an input circuit and a data latch of the semiconductor memory device according to the first embodiment.

Next, details of the configuration of the input circuit and the data latch, among, the input and output circuit according to the first embodiment, will be described with reference to FIG. 4. FIG. 4 is a circuit diagram for explaining the configuration of the input circuit and the data latch of the semiconductor memory device according to the first embodiment. In the following description, for simplicity, any one of the input circuits 221<7:0> and data latches 225<7:0> is described as an input circuit 221 and a data latch 225 corresponding to the signal DQ.

As illustrated in FIG. 4, the input circuit 221 includes a comparator COMP1 and an inverter group INV1. The input circuit 223 includes a comparator COMP2 and inverter groups INV2 and INV3.

First, the input circuits 221 and 223 will be described.

The comparator COMP1 includes a first input terminal to which the signal DQ is supplied, a second input terminal to which a voltage VREF is supplied, and an output terminal connected to an input terminal of the inverter group INV1. The voltage VREF is a reference voltage (reference signal) having a constant value and used for amplifying the signal DQ. The inverter group INV1 includes an output terminal for outputting the signal Din. The inverter group INV1, for example, generates a signal Din in which a phase of an output signal from the comparator COMP1 is inverted.

The comparator COMP2 includes a first input terminal to which the signal DQS is supplied, a second input terminal to which the signal /DQS is supplied, a first output terminal connected to an input terminal of the inverter group INV2, and a second output terminal connected to an input terminal of the inverter group INV3. The inverter groups INV2 and INV3 include output terminals for outputting the signals Sig1 and Sig2, respectively. The inverters INV2 and INV3 generate, for example, signals Sig1 and Sig2 having the same phase as that of the output signal from the comparator COMP2. The signals Sig1 and Sig2 are, for example, signals having phases inverse to that of the signal DQ.

Next, the data latch 225 will be described.

The data latch 225 includes data latches 225e and 225o. The data latches 225e and 225o alternately latch data adjacent to each other among data included in the signal Din. That is, when the data latch 225e latches even-numbered data included in the signal Din, the data latch 225o latches odd-numbered data included in the signal Din.

The data latch 225e includes transistors Tr1, Tr2, Tr3, and Tr4, and inverters INV4 and INV5. The data latch 225o includes transistors Tr5, Tr6, Tr7, and Tr8, and inverters INV6 and INV7. For example, the transistors Tr1, Tr2, Tr5, and Tr6 are P-type transistors, and the transistors Tr3, Tr4, Tr7, and Tr8 are, for example, N-type transistors.

The transistor Tr1 includes a first terminal to which a voltage VDDA is supplied, a second terminal connected to the first terminal of the transistor Tr2, and a gate to which the signal Din is supplied. The transistor Tr2 includes a second terminal connected to a node N1 and a gate supplied with the signal Sig2. The transistor Tr3 includes a first terminal connected to the node N1, a second terminal connected to the first terminal of the transistor Tr4, and a gate to which the signal Sig1 is supplied. The transistor Tr4 includes a second terminal to which the voltage VSS is supplied and a gate to which the signal Din is supplied. The voltage VDDA is a power supply voltage, and functions as the "H (High)" level for latching data within the signal Din. A voltage VSS is a ground voltage, and functions as the "L (Low)" level in the input circuits 221 and 223 and the "L" level when data in the signal Din is latched. With the configuration as described above, the transistors Tr1 to Tr4 function as inverters capable of outputting a signal obtained by inverting the signal Din to the node N1.

The inverter INV4 includes an input terminal connected to the node N1 and an output terminal connected to the input terminal of the inverter INV5. The inverter INV5 includes an output terminal connected to the node N1. As such, the inverters INV4 and INV5 are cross-connected and function as a latch circuit that latches data transferred to the node N1.

The transistor Tr5 includes a first terminal to which the voltage VDDA is supplied, a second terminal connected to the first terminal of the transistor Tr6, and a gate to which the signal Din is supplied. The transistor Tr6 includes a second terminal connected to a node N2 and a gate to which the signal Sig1 is supplied. The transistor Tr7 includes a first terminal connected to the node N2, a second terminal connected to the first terminal of the transistor Tr8, and a gate to which the signal Sig2 is supplied. The transistor Tr8 includes a second terminal to which the voltage VSS is supplied and a gate to which the signal Din is supplied. With the configuration as described above, the transistors Tr5 to Tr8 function as inverters capable of outputting a signal obtained by inverting the signal Din to the node N2.

The inverter INV6 includes an input terminal connected to the node N2 and an output terminal connected to an input terminal of the inverter INV7. The inverter INV7 includes an output terminal connected to the node N2. As such, the inverters INV6 and INV7 are cross-connected and function as a latch circuit that latches data transferred to the node N2.

A configuration of the data latch 225 is described in, for example, the "Input Circuit" in Japanese Patent Application No. 2011-81064, filed Mar. 31, 2011.

1.1.4.3 Details of Configuration of Input Circuit

Figure 5:
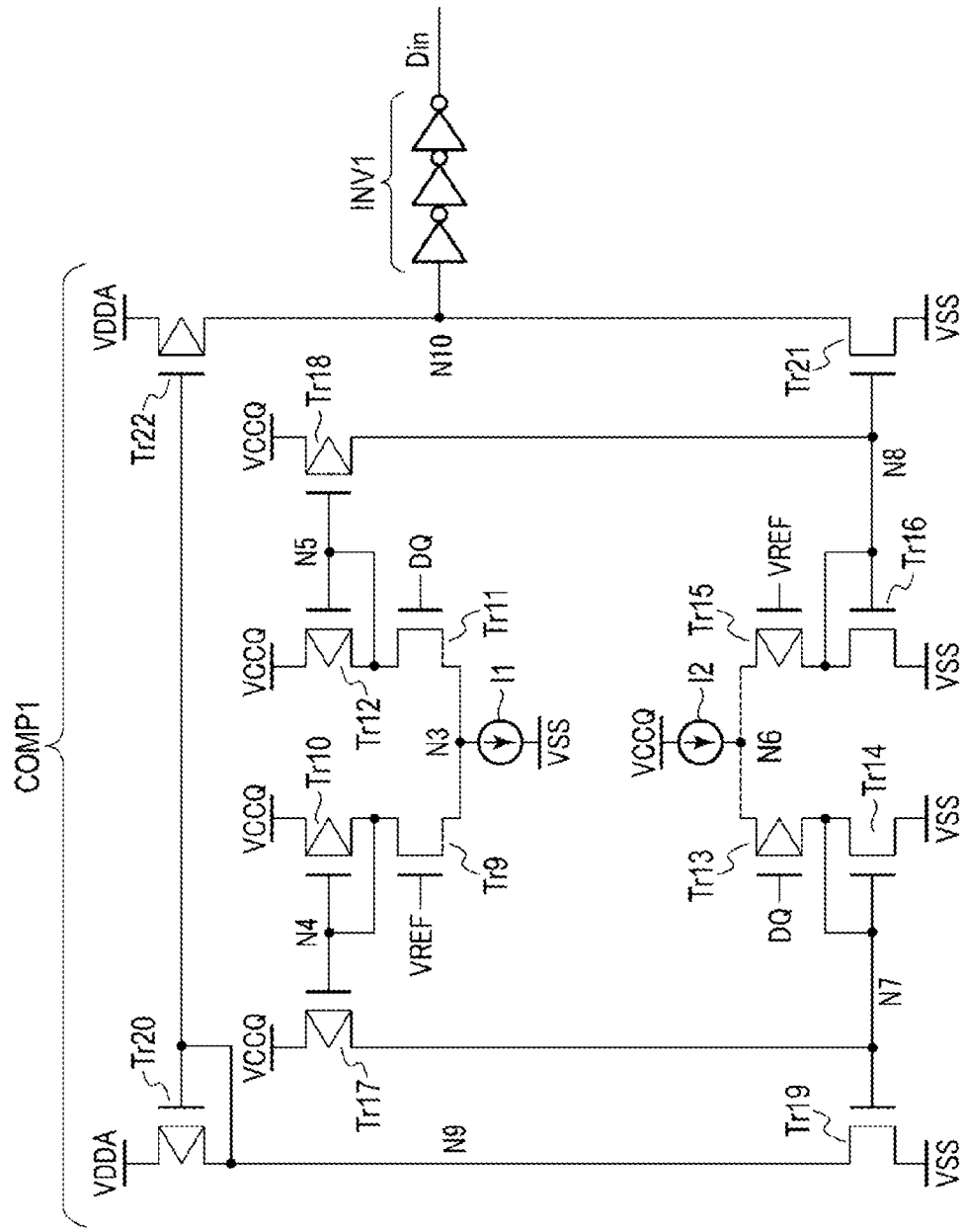
FIG. 5 is a circuit diagram of a comparator in an input circuit for an input and output signal in the semiconductor memory device according to the first embodiment.
Figure 6:
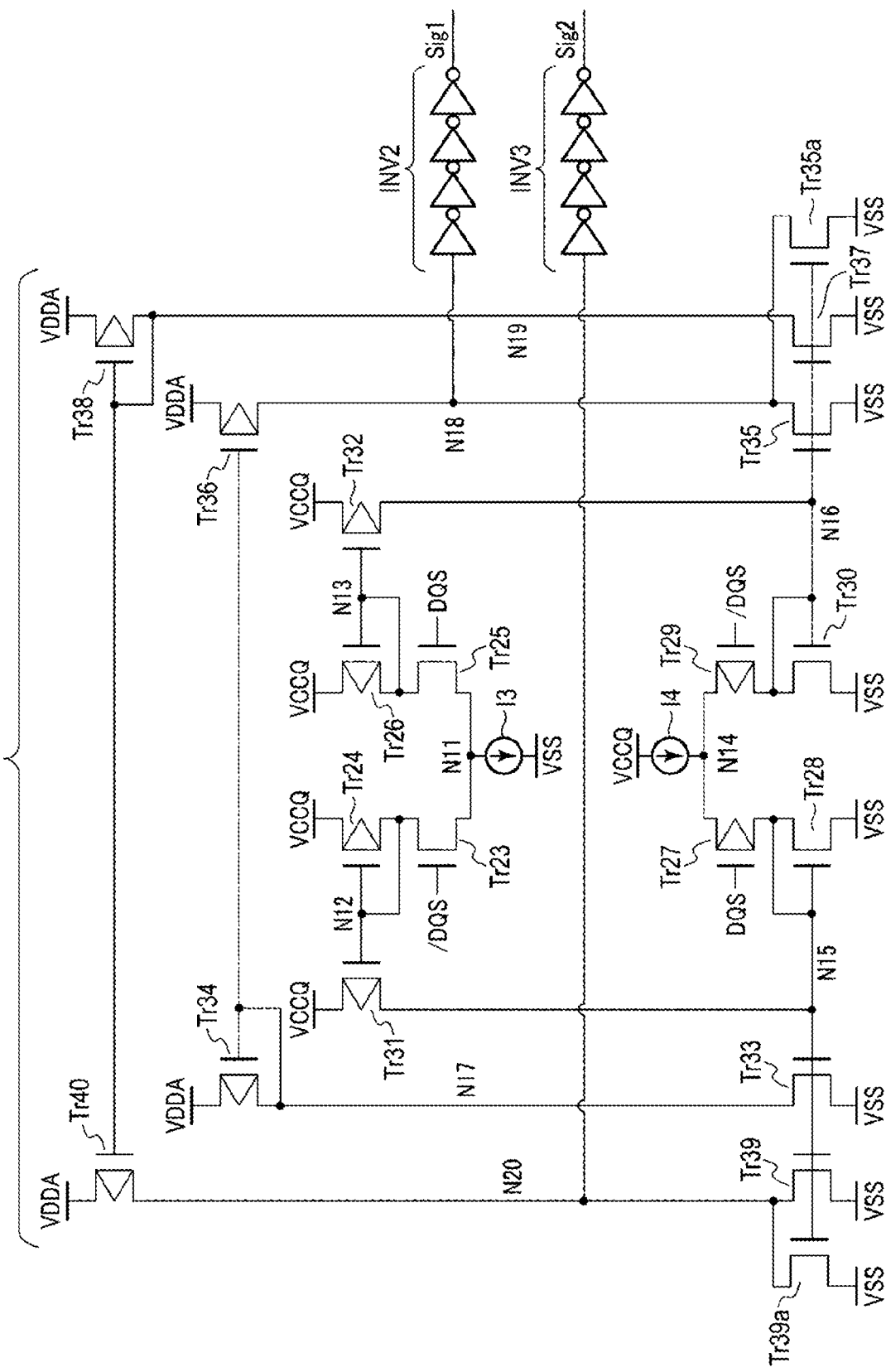
FIG. 6 is a circuit diagram of a comparator in an input circuit for a strobe signal in the semiconductor memory device according to the first embodiment.

Next, details of the configuration of the input circuit of the input and output circuit of the first embodiment, will be described with reference to FIGS. 5 and 6. FIG. 5 is a circuit diagram for explaining a configuration of an input circuit for the input and output signal DQ in the semiconductor memory device according to the first embodiment. FIG. 6 is a circuit diagram for explaining a configuration of an input circuit for strobe signals DQS and /DQS in the semiconductor memory device according to the first embodiment.

First, the configuration of the input circuit 221 for the signal DQ will be described with reference to FIG. 5.

As illustrated in FIG. 5, the comparator COMP1 in the input circuit 221 includes transistors Tr9, Tr10, Tr11, Tr12, Tr13, Tr14, Tr15, Tr16, Tr17, Tr18, Tr19, Tr20, Tr21, and Tr22, and current sources I1 and I2. The transistors Tr9, Tr11, Tr14, Tr16, Tr19, and Tr21 are, for example, N-type transistors, and the transistors Tr10, Tr12, Tr13, Tr15, Tr17, Tr18, Tr20, and Tr22 are, for example, P-type transistors.

A set including the transistors Tr9 and Tr11 and the current source I1 and a set including the transistors Tr13 and Tr15 and the current source I2 form an amplification circuit.

Each of the set including the transistors Tr10 and Tr17, the set including the transistors Tr12 and Tr18, the set including the transistors Tr14 and Tr19, the set including the transistors Tr16 and Tr21, and the set of the transistors Tr20 and Tr22 is connected to a current mirror circuit.

The current source I1 includes an input terminal connected to a node N3 and an output terminal to which the voltage VSS is supplied. The transistor Tr9 includes a first terminal connected to a node N4, a second terminal connected to the node N3, and a gate to which the voltage VREF is supplied. Transistor Tr10 includes a first terminal to which a voltage VCCQ is supplied, a second terminal and a gate connected to the node N4. The voltage VCCQ is a power supply voltage used for input and output signals, and functions as the "H" level in input circuits 221 and 223. The magnitude of the voltage VCCQ is, for example, twice the magnitude of the voltage VREF (VREF=VCCQ/2). The transistor Tr11 includes a first terminal connected to a node N5, a second terminal connected to the node N3, and a gate to which the signal DQ is supplied. The transistor Tr12 includes a first terminal to which the voltage VCCQ is supplied and a second terminal and a gate connected to the node N5.

The current source I2 includes an input terminal to which the voltage VCCQ is supplied and an output terminal connected to a node N6. The transistor Tr13 includes a first terminal connected to the node N6, a second terminal connected to a node N7, and a gate to which the signal DQ is supplied. The transistor Tr14 includes a first terminal and a gate connected to the node N7 and a second terminal to which the voltage VSS is supplied. The transistor Tr15 includes a first terminal connected to the node N6, a second terminal connected to a node N8, and a gate to which the voltage VREF is supplied. The transistor Tr16 includes a first terminal and a gate connected to the node N8 and a second terminal to which the voltage VSS is supplied.

The transistor Tr17 includes a first terminal to which the voltage VCCQ is supplied, a second terminal connected to the node N7, and a gate connected to the node N4. The transistor Tr18 includes a first terminal to which the voltage VCCQ is supplied, a second terminal connected to the node N8, and a gate connected to the node N5.

The transistor Tr19 includes a first terminal connected to a node N9, a second terminal to which the voltage VSS is supplied, and a gate connected to the node N7. The transistor Tr20 includes a first terminal to which the voltage VDDA is supplied, a second terminal and a gate connected to the node N9. The transistor Tr21 includes a first terminal connected to a node N10, a second terminal to which the voltage VSS is supplied, and a gate connected to the node N8. The transistor Tr22 includes a first terminal to which the voltage VDDA is supplied, a second terminal connected to the node N10, and a gate connected to the node N9.

The input terminal of the inverter group INV1 is connected to the node N10. That is, the inverter group INV1 receives the output signal from the comparator COMP1 via the node N10, and outputs the signal Din having a phase inverse to that of the output signal. Since a signal having a phase inverse to that of the signal DQ is supplied to the node N10, the signal Din has the same phase as that of the signal DQ.

Next, the configuration of the input circuit 223 for the signals DQS and /DQS will be described with reference to FIG. 6.

As illustrated in FIG. 6, the comparator COMP2 in the input circuit 223 includes transistors Tr23, Tr24, Tr25, Tr26, Tr27, Tr28, Tr29, Tr30, Tr31, Tr32, Tr33, Tr34, Tr35, Tr35a, Tr36, Tr37, Tr38, Tr39, Tr39a, and Tr40, and current sources 13 and 14. For example, the transistors Tr23, Tr25, Tr28, Tr30, Tr33, Tr35, Tr35a, Tr37, Tr39, and Tr39a are N-type transistors, and the transistors Tr24, Tr26, Tr27, Tr29, Tr31, Tr32, Tr34, Tr36, Tr38, and Tr40 are, for example, P-type transistors.

Each of a set including transistors Tr23 and Tr25 and the current source I3 and a set including transistors Tr27 and Tr29 and the current source I4 forms an amplification circuit.

Each of the set including transistors Tr24 and Tr31, the set including transistors Tr26 and Tr32, the set including transistors Tr28 and Tr33, the set including transistors Tr28, Tr39 and Tr39a, the set including transistors Tr30, Tr35, and Tr35a, the set including transistors Tr30 and Tr37, the set including transistors Tr34 and Tr36, and the set including transistors Tr38 and Tr40 forms a current mirror circuit.

A current source I3 includes an input terminal connected to a node N11 and an output terminal to which the voltage VSS is supplied. The transistor Tr23 includes a first terminal connected to a node N12, a second terminal connected to the node N11, and a gate to which the signal /DQS is supplied. The transistor Tr24 includes a first terminal to which the voltage VCCQ is supplied, and a second terminal and a gate connected to the node N12. The transistor Tr25 includes a first terminal connected to a node N13, a second terminal connected to the node N11, and a gate to which the signal DQS is supplied. The transistor Tr26 includes a first terminal to which the voltage VCCQ is supplied, and a second terminal and a gate connected to node N13.

A current source I4 includes an input terminal to which the voltage VCCQ is supplied and an output terminal connected to a node N14. The transistor Tr27 includes a first terminal connected to the node N14, a second terminal connected to the node N15, and a gate to which the signal DQS is supplied. The transistor Tr28 includes a first terminal and a gate connected to the node N15, and a second terminal to which the voltage VSS is supplied. The transistor Tr29 includes a first terminal connected to the node N14, a second terminal connected to a node N16, and a gate to which the signal /DQS is supplied. The transistor Tr30 includes a first terminal connected to the node N16 and a gate and a second terminal to which the voltage VSS is supplied.

The transistor Tr31 includes a first terminal to which the voltage VCCQ is supplied, a second terminal connected to the node N15, and a gate connected to the node N12. The transistor Tr32 includes a first terminal to which the voltage VCCQ is supplied, a second terminal connected to the node N16, and a gate connected to the node N13.

The transistor Tr33 includes a first terminal connected to the node N17, a second terminal to which the voltage VSS is supplied, and a gate connected to the node N15. The transistor Tr34 includes a first terminal to which the voltage VDDA is supplied, and a second terminal and a gate connected to the node N17. Each of the transistors Tr35 and Tr35a includes a first terminal connected to the node N18, a second terminal to which the voltage VSS is supplied, and a gate connected to the node N16. The transistor Tr36 includes a first terminal to which the voltage VDDA is supplied, a second terminal connected to the node N18, and a gate connected to the node N17.

The total size of the transistors Tr35 and Tr35a is larger than, for example, the size of the transistor Tr36. The size of the transistor is, for example, a ratio (W/L) of a gate width W to a gate length L of a transistor. With this, the ability of transistors Tr35 and Tr35a to pull down the node N18 can be made larger than the ability of transistor Tr36 to pull up the node N18.

The transistor Tr37 includes a first terminal connected to the node N19, a second terminal to which the voltage VSS is supplied, and a gate connected to the node N16. The transistor Tr38 includes a first terminal to which the voltage VDDA is supplied, and a second terminal and a gate connected to the node N19. Each of the transistors Tr39 and Tr39a includes a first terminal connected to the node N20, a second terminal to which the voltage VSS is supplied, and a gate connected to the node N15. The transistor Tr40 includes a first terminal to which the voltage VDDA is supplied, a second terminal connected to the node N20, and a gate connected to the node N19.

The total size of the transistors Tr39 and Tr39a is, for example, larger than the size of the transistor Tr40. With this, the ability of transistor Tr39 and Tr39a to pull down node N20 can be made larger than the ability of transistor Tr40 to pull up node N20.

In the following description, the characteristics regarding a magnitude relationship between ability to pull down signals to be supplied to nodes N18 and N20 and ability to pull up the signals is also referred to as the "pull-down/pull-up characteristic" of the comparator COMP2.

The input terminal of the inverter group INV2 is connected to the node N18. That is, the inverter group INV2 receives an output signal from the comparator COMP2 via the node N18 and outputs the signal Sig1 having the same phase as that of the output signal. Since a signal having a phase opposite to that of the signal DQS is supplied to the node N18, the signal Sig1 has a phase inverse to that of the signal DQS.

The input terminal of the inverter group INV3 is connected to the node N20. That is, the inverter group INV3 receives an output signal from the comparator COMP2 via the node N20 and outputs the signal Sig2 having the same phase as the output signal. Since a signal having a phase opposite to the signal /DQS (that is, a signal having the same phase as the signal DQS) is supplied to the node N20, the signal Sig2 is a signal having a phase opposite to the signal /DQS (or signal having the same phase as that of signal DQS).

1.2 Operation

Next, an operation of the semiconductor memory device according to the first embodiment will be described.

Figure 7:
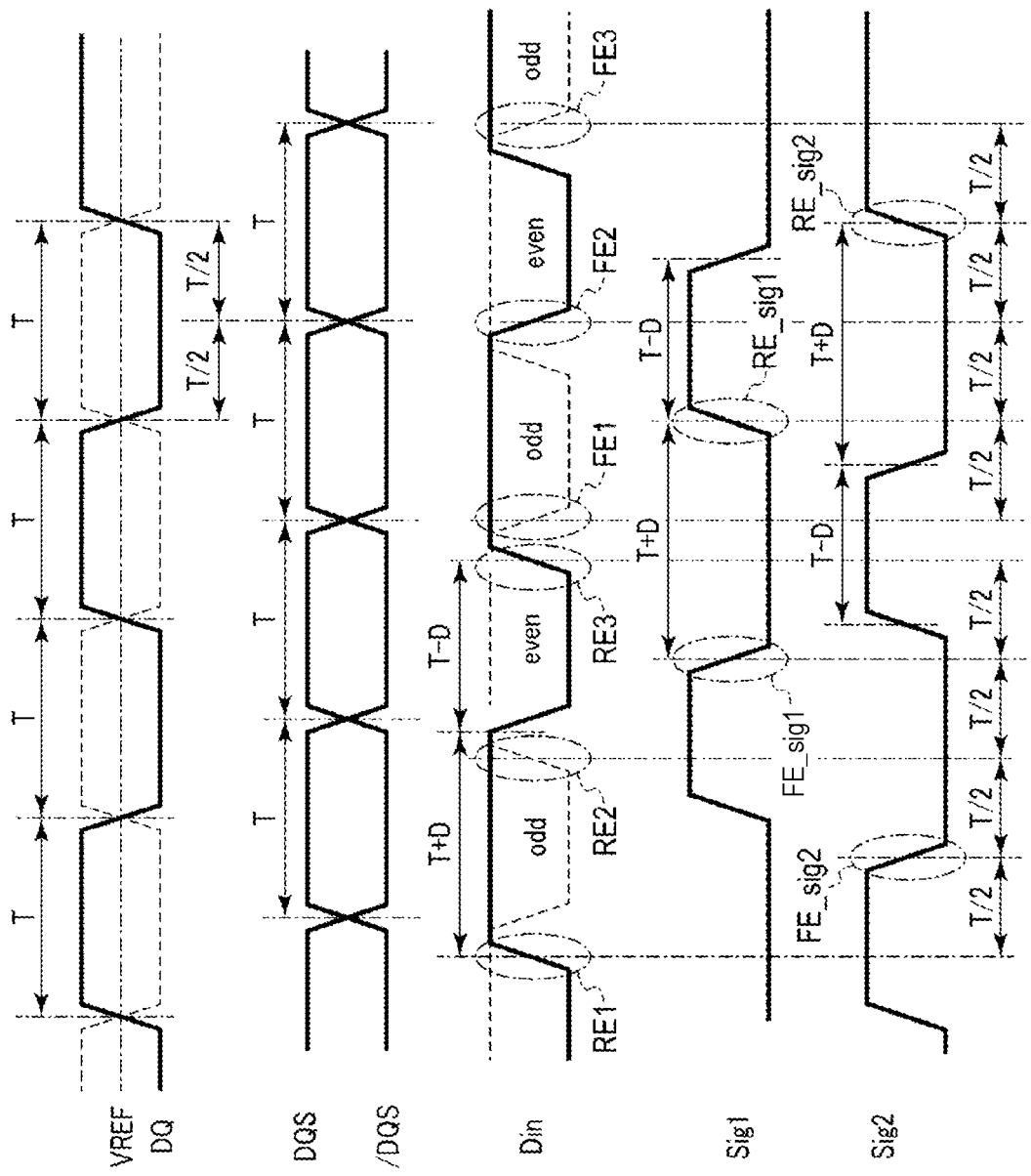
FIG. 7 is a timing chart for explaining an input operation in the semiconductor memory device according to the first embodiment.

The operation of the input circuit of the semiconductor memory device according to the first embodiment will be described with reference to a timing chart illustrated in FIG. 7. In FIG. 7, the signal DQ, the signals DQS and /DQS, and the signal Din and the signals Sig1 and Sig2 generated from these various signals are illustrated.

First, an operation of generating the signal Din from the signal DQ in the input circuit 221 will be described.

As illustrated in FIG. 7, the signal DQ has a shape in which, for example, pulses in which data is encoded every period T are continuous. That is, the signal DQ can ideally take either in the "H" level or the "L" level (duty ratio can be 50%) every period T.

When the signal DQ is switched from the "H" level to the "L" level as described above, the transistor Tr13 is turned ON, and the node N7 is charged with electric charges. When the node N7 goes to the "H" level, the transistor Tr19 is turned ON, and electric charges are discharged from the node N9. When the node N9 goes to the "L" level, the transistor Tr22 is turned ON. On the other hand, when the transistor Tr13 is turned ON, the current flowing to the node N8 via the transistor Tr15 decreases and electric charges are discharged from the node N8. When the node N8 goes to the "L" level, the transistor Tr21 is turned OFF, and the node N10 is charged with electric charges. With this, the node N10 goes to the "H" level, and finally the signal Din in the "L" level having the same phase as that of the signal DQ is output with a slight delay via the inverter group INV1.

Further, for example, in a case where the signal DQ is switched from the "L" level to the "H" level, the transistor Tr11 is turned ON, and electric charges are discharged from the node N5. When the node N5 goes to the "L" level, the transistor Tr18 is turned ON, and the node N8 is charged with electric charges. When the node N8 goes to the "H" level, the transistor Tr21 is turned ON. On the other hand, when the transistor Tr11 is turned ON, the current flowing to the node N4 via the transistor Tr9 decreases and the node N4 is charged with electric charges. When the node N4 goes to the "H" level, the transistor Tr17 is turned OFF, and electric charges are discharged from the node N7. When the node N7 goes to the "L" level, the transistor Tr19 is turned OFF, and the node N9 is charged with electric charges. When the node N9 goes to the "H" level, the transistor Tr22 is turned OFF. With this, the node N10 goes to the "L" level, and finally the signal Din in the "H" level having the same phase as that of the signal DQ is output with a slight delay via the inverter group INV1.

However, in the comparator COMP1, the signal Din is generated based on the magnitude relationship between the voltage VREF and the voltage of the signal DQ. For that reason, the duty ratio of the signal Din is likely to vary with respect to the duty ratio of the signal DQ. For that reason, as illustrated in FIG. 7, as for the signal Din, for example, the ratio of the "H" level to the "L" level can be increased (duty ratio can be larger than 50%). In the example of FIG. 7, the signal Din has a period (T+D) during which the signal Din is in the "H" level is longer than the period T by the period D, whereas has a period during which the signal Din is in the "L" level is a period (T−D).

Next, an operation of generating the signals Sig1 and Sig2 from the signals DQS and /DQS in the input circuit 223 will be described with continued reference to FIG. 7.

As illustrated in FIG. 7, the signals DQS and /DQS are input, for example, as waveforms whose phases are deviated by 90 degrees with respect to the signal DQ. That is, the signals DQS and /DQS can ideally have a duty ratio of 50%, similar to the signal DQ. Also, intersection points of the signals DQS and /DQS can ideally be positioned respectively at places a period T/2 away from intersection points of the signal DQ and the voltage VREF that are present before and after the intersection points of the signals DQS and /DQS.

In a case where the signal DQS as described above is switched from the "H" level to the "L" level, the transistor Tr27 is turned ON and the node N15 is charged with electric charges. When the node N15 goes to the "H" level, the transistor Tr33 is turned ON, and electric charges are discharged from the node N17. When the node N17 goes to the "L" level, the transistor Tr36 is turned ON. On the other hand, when the transistor Tr27 is turned ON, the current flowing to the node N16 via the transistor Tr29 decreases, and electric charges are discharged from the node N16. When the node N16 goes to the "L" level, the transistors Tr35 and Tr35a are turned OFF, and the node N18 is charged with electric charges. With this, the node N18 goes to the "H" level, and finally the signal Sig1 in the "H" level having a phase inverse to that of the signal DQS is output via the inverter group INV3.

Also, when the node N16 goes to the "L" level, the transistor Tr37 is turned OFF, and the node N19 is charged with electric charges. When the node N19 goes to the "H" level, the transistor Tr40 is turned OFF. On the other hand, when the node N15 goes to the "H" level, the transistors Tr39 and 39a are turned ON, and electric charges are discharged from the node N20. With this, the node N20 goes to the "L" level, and finally the signal Sig2 in the "L" level having the same phase as that of the signal DQS is output via the inverter group INV3.

In addition, for example, in a case where the signal DQS is switched from the "L" level to the "H" level, the transistor Tr25 is turned ON, and electric charges are discharged from the node N13. When the node N13 goes to the "L" level, the transistor Tr32 is turned ON, and the node N16 is charged with electric charges. When the node N16 goes to the "H" level, the transistors Tr35 and Tr35a are turned ON. On the other hand, when the transistor Tr25 is turned ON, the current flowing to the node N12 via the transistor Tr23 decreases and the node N12 is charged with electric charges. When the node N12 goes to the "H" level, the transistor Tr31 is turned OFF, and electric charges are discharged from node N15. When the node N15 goes to the "L" level, the transistor Tr33 is turned OFF, and the node N17 is charged with electric charges. When the node N17 goes to the "H" level, the transistor Tr36 is turned OFF, and electric charges are discharged from the node N18. With this, the node N18 goes to the "L" level, and finally the signal Sig1 in the "L" level having a phase inverse to that of the signal DQS is output via the inverter group INV2.

When the node N16 goes to the "H" level, the transistor Tr37 is turned ON, and electric charges are discharged from the node N19. When the node N19 goes to the "L" level, the transistor Tr40 is turned ON. On the other hand, when the node N15 goes to the "L" level, the transistors Tr39 and Tr39a are turned OFF, and the node N20 is charged with electric charges. With this, the node N20 goes to the "H" level, and finally the signal Sig2 in the "H" level having the same phase as that of the signal DQS is output via the inverter group INV3.

The comparator COMP2 generates the signals Sig1 and Sig2 based on the magnitude relationship between the voltage of the signal DQS and the voltage of the signal /DQS. Since the signals DQS and /DQS are complementary to each other, an amount of relative change between the signals is larger than that of the comparator COMP1. For that reason, it is possible to make an unintentional variation amount of the duty ratio of the signals Sig1 and Sig2 with respect to the signals DQS and /DQS smaller than an unintentional variation amount of the duty ratio of the signal Din with respect to the signal DQ.

In the first embodiment, the comparator COMP2 having the characteristics described above is intentionally changed from the duty ratio of the signals Sig1 and Sig2. That is, in addition to the transistor Tr35, the transistor Tr35a is connected in parallel to the comparator COMP2. With this, the ability of the transistors Tr35 and Tr35a to pull down a potential of the node N18 is larger than the ability of the transistor Tr36 to pull up the potential of the node N18. For that reason, the comparator COMP2 can make the duty ratio of the signal to be supplied to the node N18 smaller than 50%. The signal Sig1 becomes a signal having the same phase as that of the node N18 by the inverter group INV2. For that reason, as illustrated in FIG. 7, as a result, the signal Sig1 becomes a signal having a phase inverse to that of the signal DQS and has a duty ratio smaller than 50%.

Similarly, in addition to the transistor Tr39, the transistor Tr39a is connected in parallel to the comparator COMP2. With this, the ability of transistors Tr39 and Tr39a to pull down the potential of the node N20 is larger than the ability of transistor Tr40 to pull up the potential of the node N20. For that reason, the comparator COMP2 can make the duty ratio of the signal to be supplied to the node N20 smaller than 50%. The signal Sig2 becomes a signal having the same phase as that of the node N20 by the inverter group INV3. For that reason, as illustrated in FIG. 7, as a result, the signal Sig2 becomes a signal having the same phase as that of the signal DQS and has a duty ratio smaller than 50%.

In the example of FIG. 7, the signals Sig1 and Sig2 are adjusted by the transistors Tr35a and Tr39a such that the signals Sig1 and Sig2 have a period during which the Sig1 and Sig2 are in the "H" level is shorter than the period T by a period D is the period (T−D) whereas have a period during which the signals Sig1 and Sig2 are in the "L" level is the period (T+D).

For that reason, a rising edge RE_sig1 in the signal Sig1 is adjusted so as to be positioned at an intermediate position between an edge FE1 at which the odd-numbered (described as the "odd" in FIG. 7) pulse in the signal Din falls to the "L" level and an edge FE2 at which the even-numbered pulse in the signal Din falls to the "L" level. A falling edge FE_sig1 in the signal Sig1 is adjusted so as to be positioned at an intermediate position between an edge RE2 at which the even-numbered pulse in the signal Din rises to the "H" level and an edge RE3 at which the odd-numbered pulse in the signal Din rises to the "H" level.

A rising edge RE_Sig2 in the signal Sig2 is adjusted so as to be positioned at an intermediate position between the edge FE2 at which the even-numbered pulse in the signal Din falls to the "L" level and an edge FE3 at which the odd-numbered pulse in the signal Din falls to the "L" level. A falling edge FE_Sig2 in the signal Sig2 is adjusted so as to be positioned at an intermediate position between the edge RE1 at which the odd-numbered pulse in the signal Din rises to the "H" level and the edge RE2 at which the even-numbered pulse in the signal Din rises to the "H" level.

By operating as described above, the timing at which the signal Din is to be strobed by the signals Sig1 and Sig2 is adjusted so as to be far from the timing at which the level of the signal Din changes. With this, deterioration of setup time and hold time can be prevented.

1.3 Effects According to First Embodiment

According to the first embodiment, the characteristics of the input signal can be improved. This effect will be described below.

The comparator COMP2 outputs the signals Sig1 and Sig2 based on the signals DQS and /DQS. The comparator COMP2 can make the duty ratio of the signal Sig1 smaller than the duty ratio of the signal DQS by making the ability to pull down the potential of the node N18 larger than the ability to pull up the potential of the node N18. With this, even in a case where the duty ratio of the signal Din becomes larger than the duty ratio of the signal DQ, the position of the edge of the signal Sig1 input to the data latch 225 can be adjusted appropriately with respect to the position of the edge of the signal Din. More specifically, the position of the falling edge FE_sig1 of the signal Sig1 input to the data latch 225e can be adjusted to an intermediate position between the rising edges RE2 and RE3 of the signal Din and the position of the rising edge RE_sig1 of the signal Sig1 input to the data latch 225o can be adjusted to an intermediate position between the falling edges FE1 and FE2 of the signal Din.

The comparator COMP2 can make the duty ratio of the signal Sig2 smaller than the duty ratio of the signal /DQS by making the ability to pull down the potential of the node N20 larger than the ability to pull up the potential of the node N20. With this, even in a case where the duty ratio of the signal Din becomes larger than the duty ratio of the signal DQ, the position of the edge of the signal Sig2 input to the data latch 225 can be adjusted appropriately with respect to the position of the edge of the signal Din. More specifically, the position of the rising edge RE_Sig2 of the signal Sig2 input to the data latch 225e can be adjusted to an intermediate position between the falling edges FE2 and FE3 of the signal Din and the position of the rising edge RE_Sig2 of the signal Sig2 input to the data latch 225o can be adjusted to an intermediate position between the rising edges RE1 and RE2 of the signal Din.

For that reason, even in a case where the characteristics of the signal Din is more likely to deteriorate than the characteristics of the signals Sig1 and Sig2, it is possible to compensate for the deterioration by causing the waveforms of the signals Sig1 and Sig2 to follow the signal Din. Accordingly, it is possible to improve the characteristics of the input signal while using the comparator COMP2 for differentially amplifying complementary signals and the comparator COMP1 for differentially amplifying a reference voltage.

As described above, according to the first embodiment, the waveforms of the signals Sig1 and Sig2 are caused to follow the signal Din. For that reason, even in a case where the duty ratio of the signals DQS and /DQS input to the input circuit 223 are already deviated (that is, the intersection points of the signals DQS and /DQS are deviated from the voltage VREF), it is possible to achieve consistency with the signal Din while compensating for the deviation. Accordingly, it is possible to improve the characteristics of the input signal while taking the deviation of the duty ratio of the signals DQS and /DQS into consideration.

1.4 Modification Example

In the first embodiment, the configuration and operation of the comparator COMP2 in the case where the duty ratio of the signal Din is larger than 50% is described, but the present disclosure is not limited thereto. For example, even in a case where the duty ratio of the signal Din becomes smaller than 50%, the characteristics of the input signal can be improved by appropriately configuring the comparator COMP2.

In the following description, the description of the same portions as the configuration and operation of the first embodiment will be omitted, and portions different from the configuration and operation of the first embodiment will be mainly described.

1.4.1 Details of Configuration of Input Circuit

Figure 8:
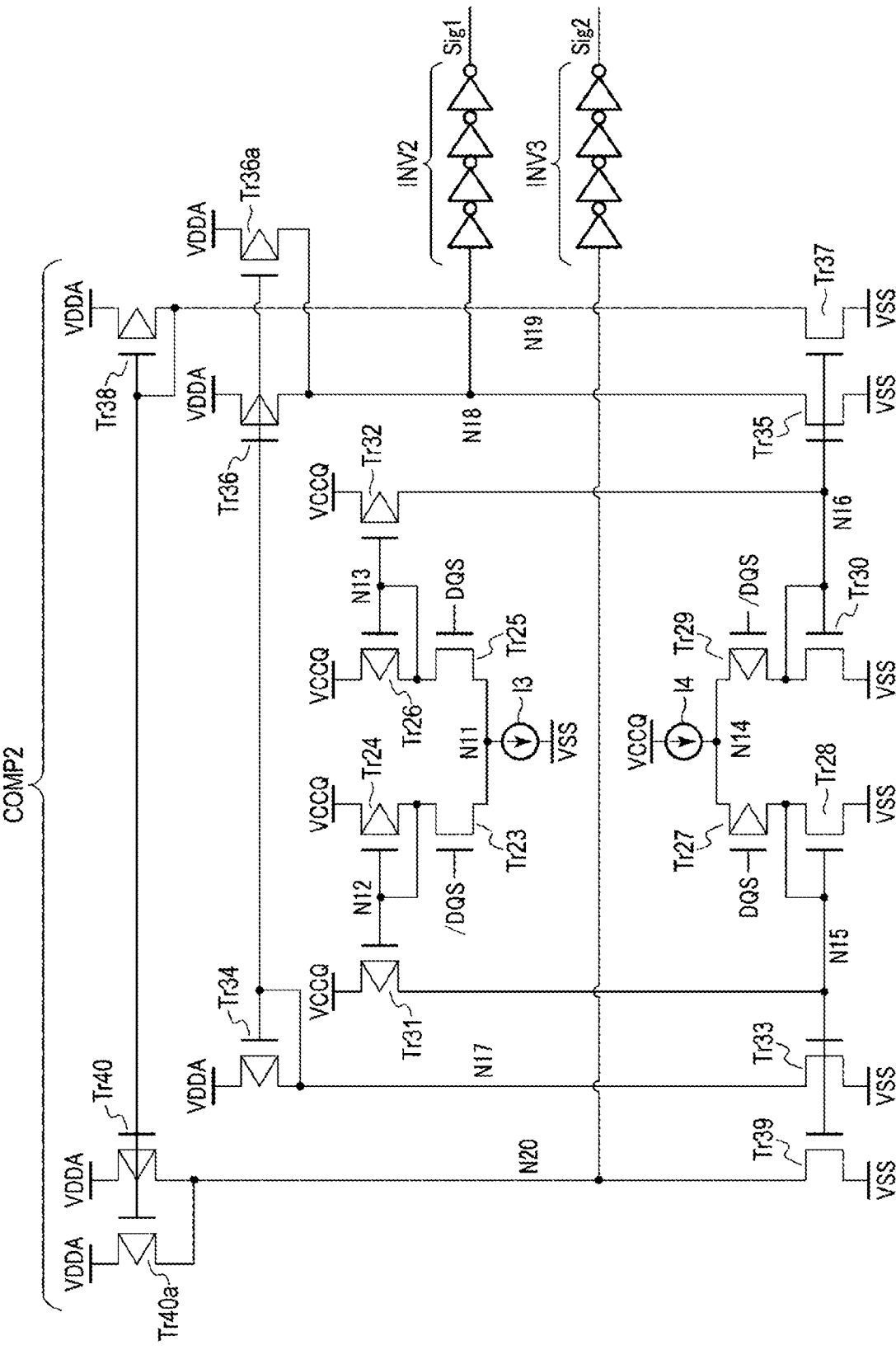
FIG. 8 is a circuit diagram of a comparator in an input circuit for a strobe signal of a semiconductor memory device according to a modification example of the first embodiment.

FIG. 8 is a circuit diagram for explaining a configuration of an input circuit of a strobe signal according to a modification example of the first embodiment. FIG. 8 corresponds to FIG. 6 described in the first embodiment.

As illustrated in FIG. 8, the comparator COMP1 includes transistors Tr36a and Tr40a instead of the transistors Tr35a and Tr39a. The transistors Tr36a and Tr40a are P-type transistors.

Each of the set including the transistors Tr34, Tr36, and Tr36a and the set including the transistors Tr38, Tr40, and Tr40a forms a current mirror circuit.

The transistor Tr36a is connected in parallel with the transistor Tr36. That is, the transistor Tr36a includes a first terminal to which the voltage VDDA is supplied, a second terminal connected to the node N18, and a gate connected to the node N17.

The total size of the transistors Tr36 and Tr36a is, for example, larger than the size of the transistor Tr36. With this, the ability of transistors Tr36 and T36a to pull up the node N18 can be configured to be larger than the ability of transistor Tr35 to pull down the node N18.

The transistor Tr40a includes a first terminal to which the voltage VDDA is supplied, a second terminal connected to the node N20, and a gate connected to the node N19.

The total size of the transistors Tr40 and Tr40a is, for example, larger than the size of the transistor Tr39. With this, the ability of the transistors Tr40 and Tr40a to pull up the node N20 can be configured to be larger than the ability of the transistor Tr39 to pull down the node N20.

With the configuration as described above, in a case where the duty ratio of the signal Din becomes smaller than 50%, the strobe timing can be appropriately set.

1.4.2 Operation of Input Circuit

Figure 9:
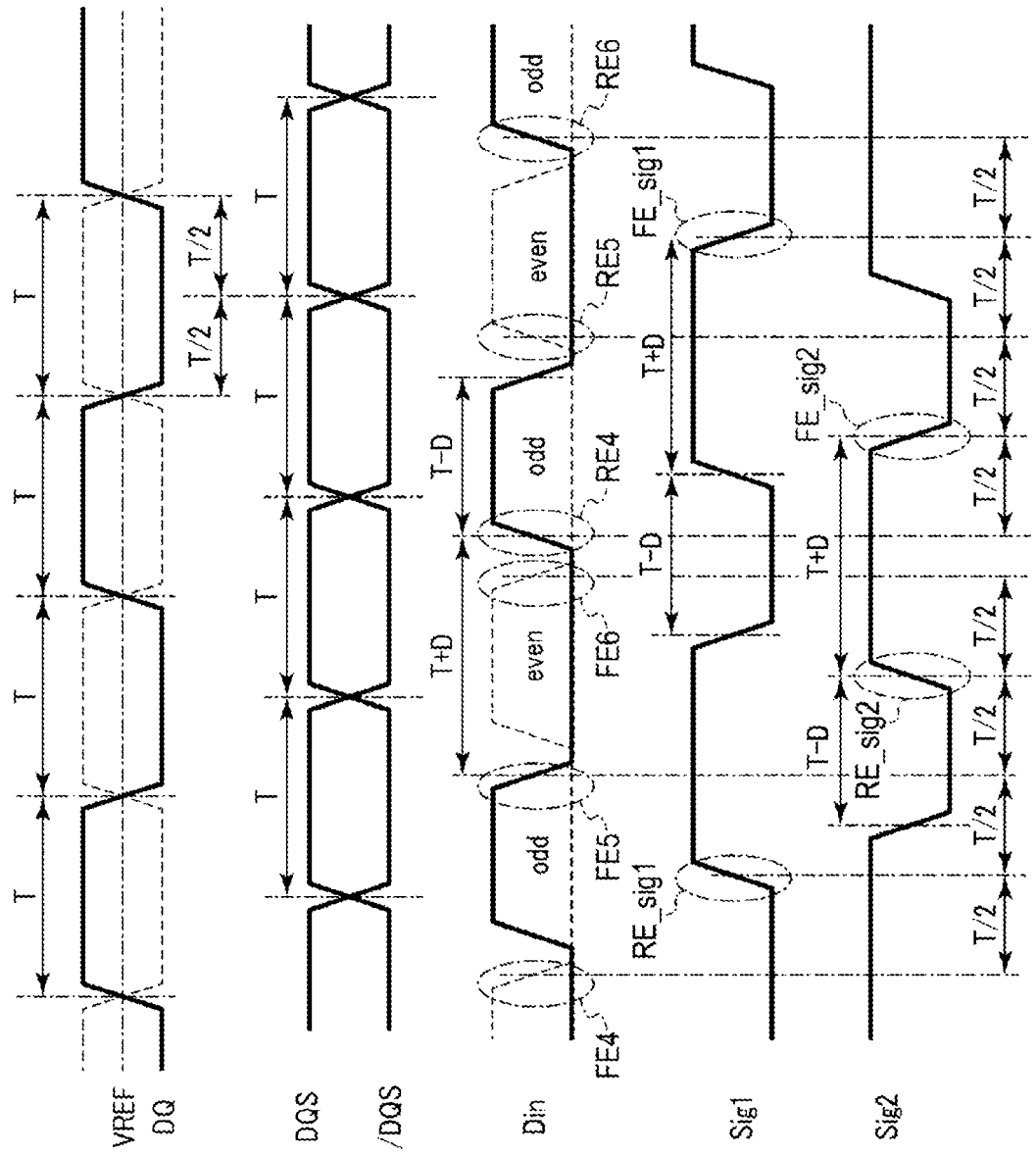
FIG. 9 is a timing chart for explaining an input operation in the semiconductor memory device according to the modification example of the first embodiment.

FIG. 9 is a timing chart for explaining an operation of the input circuit of the semiconductor memory device according to the modification example of the first embodiment. FIG. 9 corresponds to FIG. 7 described in the first embodiment.

As illustrated in FIG. 9, as for the signal Din, for example, the ratio of the "H" level to the "L" level can be reduced (duty ratio can be smaller than 50%). In the example of FIG. 9, the signal Din has the period (T−D) during which the signal Din is in the "H" level is shorter than the period T by the period D, whereas has a period during which the signal Din is in the "L" level is the period (T+D).

In the modification example of the first embodiment, in addition to the transistor Tr36, the transistor Tr36a is connected in parallel to the comparator COMP2. With this, the ability of the transistors Tr36 and Tr36a to pull up the potential of the node N18 is larger than the ability of the transistor Tr35 to pull down the potential of the node N18. For that reason, the comparator COMP2 can make the duty ratio of the signal to be supplied to the node N18 larger than 50%. For that reason, as illustrated in FIG. 9, as a result, the signal Sig1 becomes a signal having a phase inverse to that of the signal DQS and has a duty ratio larger than 50%.

Similarly, in addition to the transistor Tr40, the transistor Tr40a is connected in parallel to the comparator COMP2. With this, the ability of transistors Tr40 and Tr40a to pull up the potential of node N20 is larger than the ability of transistor Tr39 to pull down the potential of node N20. For that reason, the comparator COMP2 can make the duty ratio of the signal to be supplied to the node N20 larger than 50%. For that reason, as illustrated in FIG. 9, as a result, the signal Sig2 becomes a signal having the same phase as that of the signal DQS and has a duty ratio larger than 50%.

In the example of FIG. 9, the signals Sig1 and Sig2 are adjusted by the transistors Tr36a and Tr40a such that the signals Sig1 and Sig2 have a period during which the Sig1 and Sig2 are in the "H" level is longer than the period T by a period D is the period (T+D) whereas have a period during which the signals Sig1 and Sig2 are in the "L" level is the period (T−D).

For that reason, the rising edge RE_sig1 in the signal Sig1 is adjusted so as to be positioned at an intermediate position between an edge FE4 at which the odd-numbered pulse in the signal Din falls to the "L" level and an edge FE5 at which the even-numbered pulse in the signal Din falls to the "L" level. The falling edge FE_sig1 in the signal Sig1 is adjusted so as to be positioned at an intermediate position between an edge RE5 at which the even-numbered pulse in the signal Din rises to the "H" level and an edge RE6 at which the odd-numbered pulse in the signal Din rises to the "H" level.

The rising edge RE_sig2 in the signal Sig2 is adjusted so as to be positioned at an intermediate position between an edge FE5 at which the even-numbered pulse in the signal Din falls to the "L" level and an edge FE6 at which the odd-numbered pulse in the signal Din falls to the "L" level. The falling edge FE_sig2 in the signal Sig2 is adjusted so as to be positioned at an intermediate position between the edge RE4 at which the odd-numbered pulse in the signal Din rises to the "H" level and the edge RE5 at which the even-numbered pulse in the signal Din rises to the "H" level.

By operating as described above, the timing at which the signal Din is to be strobed by the signals Sig1 and Sig2 is adjusted so as to be far from the timing at which the level of the signal Din changes. With this, deterioration of setup time and hold time can be prevented.

1.4.3 Effect According to Modification Example

According to the modification example of the first embodiment, the comparator COMP2 can make the duty ratio of the signal Sig1 larger than the duty ratio of the signal DQS by making the ability to pull up the potential of the node N18 larger than the ability to pull down the potential of the node N18. With this, even in a case where the duty ratio of the signal Din becomes smaller than the duty ratio of the signal DQ, the position of the edge of the signal Sig1 input to the data latch 225 can be adjusted appropriately with respect to the position of the edge of the signal Din. More specifically, the position of the falling edge FE_sig1 of the signal Sig1 input to the data latch 225e can be adjusted to an intermediate position between the rising edges RE5 and RE6 of the signal Din and the position of the rising edge RE_sig1 of the signal Sig1 input to the data latch 225o can be adjusted to an intermediate position between the falling edges FE4 and FE5 of the signal Din.

The comparator COMP2 can make the duty ratio of the signal Sig2 larger than the duty ratio of the signal /DQS by making the ability to pull up the potential of the node N20 larger than the ability to pull down the potential of the node N20. With this, even in a case where the duty ratio of the signal Din becomes smaller than the duty ratio of the signal DQ, the position of the edge of the signal Sig2 input to the data latch 225 can be adjusted appropriately with respect to the position of the edge of the signal Din. More specifically, the position of the falling edge FE_Sig2 of the signal Sig2 input to the data latch 225e can be adjusted to an intermediate position between the rising edges RE4 and RE5 of the signal Din and the position of the rising edge RE_Sig2 of the signal Sig2 input to the data latch 225o can be adjusted to an intermediate position between the falling edges FE5 and FE6 of the signal Din.

2. Second Embodiment

Next, a semiconductor memory device according to a second embodiment will be described. In the first embodiment, the case where four timings for latching data in the signal Din are controlled by two signals of the signals Sig1 and Sig2 is described. The second embodiment is different from the first embodiment in that four timings are controlled by four signals. Hereinafter, the description of the same portions as the configuration and operation of the modification example of the first embodiment will be omitted, and portions different from the configuration and operation of the first embodiment or the modification example of the first embodiment will be mainly described.

2.1 Configuration of Input Circuit and Data Latch

Figure 10:
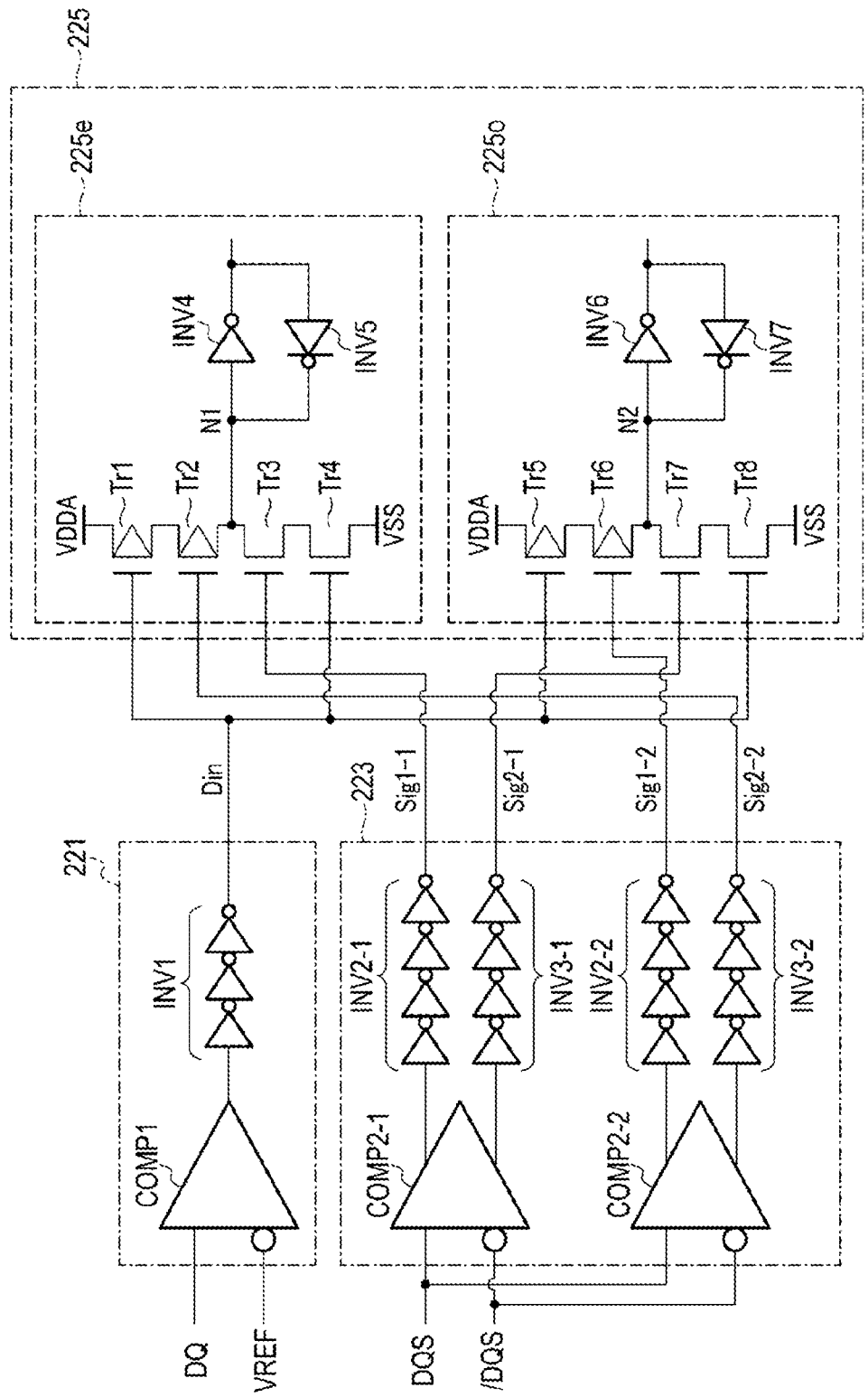
FIG. 10 is a circuit diagram of an input circuit and a data latch of a semiconductor memory device according to a second embodiment.

FIG. 10 is a circuit diagram for explaining a configuration of an input circuit and a data latch of a semiconductor memory device according to a second embodiment. FIG. 10 corresponds to FIG. 4 described in the first embodiment.

As illustrated in FIG. 10, the input circuit 223 includes comparators COMP2-1 and COMP2-2, and inverter groups INV2-1, INV2-2, INV3-1, and INV3-2.

More specifically, the comparator COMP2-1 includes a first input terminal to which the signal DQS is supplied, a second input terminal to which the signal /DQS is supplied, a first output terminal connected to an input terminal of the inverter group INV2-1, and a second output terminal connected to an input terminal of the inverter group INV3-1. Each of the inverter groups INV2-1 and INV3-1 includes an output terminal for outputting signals Sig1-1 and Sig2-1. The signal Sig1-1 is connected to the gate of transistor Tr3 in the data latch 225e. The signal Sig2-1 is connected to the gate of transistor Tr7 in the data latch 225o.

The comparator COMP2-2 includes a first input terminal to which the signal DQS is supplied, a second input terminal to which the signal /DQS is supplied, a first output terminal connected to an input terminal of the inverter group INV2-2, and a second output terminal connected to an input terminal of the group INV3-2. Each of the inverter groups INV2-2 and INV3-2 includes an output terminal for outputting signals Sig1-2 and Sig2-2. The signal Sig1-2 is connected to the gate of transistor Tr6 in the data latch 225o. The signal Sig2-2 is connected to the gate of transistor Tr2 in the data latch 225e.

The circuit configuration of the comparators COMP2-1 and COMP2-2 is basically equivalent to the circuit configuration of the comparator COMP2 described in the first embodiment or the modification example of the first embodiment. However, the pull-down/pull-up characteristics of the node N18 and the pull-down/pull-up characteristics of the node N20 in the comparator COMP2-1 are selected independently of each other. The pull-down/pull-up characteristics of the node N18 and the pull-down/pull-up characteristics of the node N20 in the comparator COMP2-2 are selected independently of each other. In addition, the pull-down/pull-up characteristics of the comparator COMP2-1 and the pull-down/pull-up characteristics of the comparator COMP2-2 are independently set.

With the configuration as described above, the signals Sig1-1, Sig1-2, Sig2-1, and Sig2-2 can be controlled independently.

2.2 Operation of Input Circuit

Figure 11:
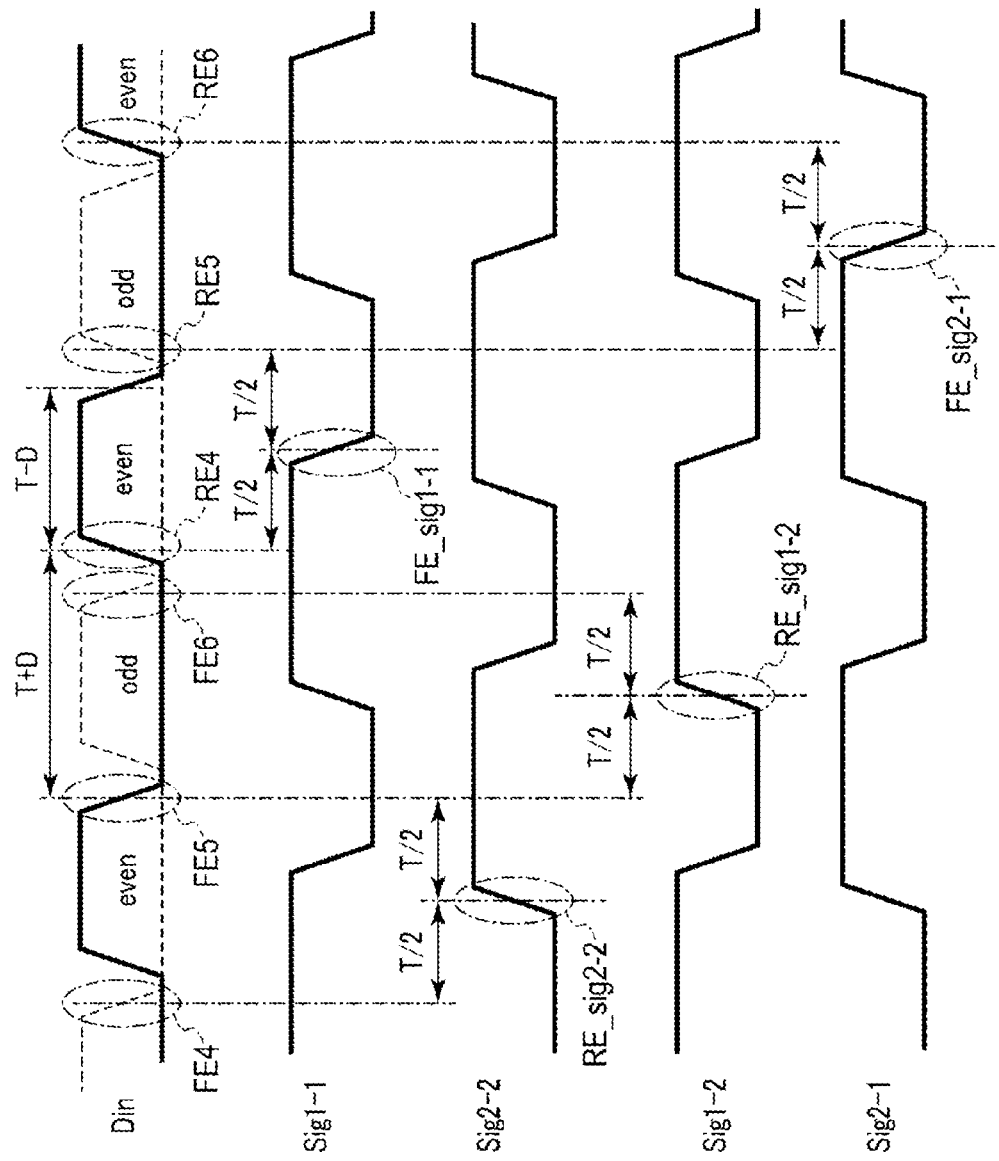
FIG. 11 is a timing chart for explaining an input operation in the semiconductor memory device according to the second embodiment.

The operation of the input circuit of the semiconductor memory device according to the second embodiment will be described with reference to the timing chart illustrated in FIG. 11. In FIG. 11, the signal Din and the signals Sig1 and Sig2 generated from the signals DQS and /DQS are illustrated. In FIG. 11, as an example, a case where the same signal Din as that in FIG. 9 illustrated in the modification example of the first embodiment is supplied is illustrated.

As illustrated in FIG. 10, the signal Sig1-1 is supplied only to the transistor Tr3 of the data latch 225e. With this, the signal Sig1-1 becomes a valid signal only in a latch operation when the even-numbered pulse of the signal Din goes to the "H" level. For that reason, as shown in FIG. 11, if the falling edge FE_sig1-1 is controlled to be positioned at the intermediate position between the edge RE4 at which the even-numbered pulse rises to the "H" level and the edge RE5 at which the odd-numbered pulse rises to the "H" level, the signal Sig1-1 can be optimal.

The signal Sig2-2 is supplied only to the transistor Tr2 of the data latch 225e. With this, the signal Sig2-2 becomes a valid signal only during the latch operation when the even-numbered pulse of the signal Din goes to the "L" level. For that reason, if the rising edge RE_sig2-2 is controlled to be positioned at the intermediate position between the edge FE4 at which the even-numbered pulse falls to the "L" level and the edge FE5 at which the odd-numbered pulse falls to the "L" level, the signal Sig2-2 can be optimal.

Further, the signal Sig1-2 is supplied only to the transistor Tr6 of the data latch 225o. With this, the signal Sig1-2 is a valid signal only during the latch operation when the odd-numbered pulse of the signal Din goes to the "L" level. For that reason, if the rising edge RE_sig1-2 is controlled to be positioned at the intermediate position between the edge FE5 at which the odd-numbered pulse falls to the "L" level and the edge FE6 at which the even-numbered pulse falls to the "L" level, the signal Sig1-2 can be optimal.

The signal Sig2-1 is supplied only to the transistor Tr7 of the data latch 225o. With this, the signal Sig2-1 is a valid signal only during the latch operation when the odd-numbered pulse of the signal Din goes to the "H" level. For that reason, if the falling edge FE_Sig2-1 is controlled to be positioned at the intermediate position between the edge RE5 at which the odd-numbered pulse rises to the "H" level and the edge RE6 at which the even-numbered pulse rises to the "H" level, the signal Sig2-1 can be optimal.

As described above, the signals Sig1-1, Sig1-2, Sig2-1, and Sig2-2 can be controlled independently of each other. More specifically, the signals Sig1-1 and Sig2-1 are respectively associated with the signal supplied to the node N18 in the comparator COMP2-1 and the signal supplied to the node N20. The signals Sig1-2 and Sig2-2 are respectively associated with the signal supplied to the node N18 in the comparator COMP2-2 and the signal supplied to the node N20. The pull-down/pull-up characteristics of the nodes N18 and N20 in the comparator COMP2-1 and the pull-down/pull-up characteristics of the nodes N18 and N20 comparator COMP2-2 are independently adjusted so as to make it possible to adjust all the latch timings to the optimum positions.

2.3 Effect According to Second Embodiment

In the second embodiment, four signals Sig1-1, Sig2-1, Sig1-2, and Sig2-2 independent of each other are generated by the two comparators COMP2-1 and COMP2-2. With this, strobe signals independent of each other can be supplied with respect to the four latch timings for determining data in the data latch 225. For that reason, even in a case where the signal Din has a complexly disturbed shape, it is possible to adjust the four latch timings to the optimum positions, respectively. Accordingly, the characteristics of the input signal can be improved.

2.4 Modification Example

In the second embodiment, the case where the four latch timings are adjusted to the optimum positions by adjusting in advance the pull-down/pull-up characteristics in the comparators COMP2-1 and COMP2-2 is described. The present disclosure is however not limited thereto. For example, the four latch timings may be dynamically controlled based on latched data.

2.4.1 Configuration of Input Circuit and Data Latch

Figure 12:
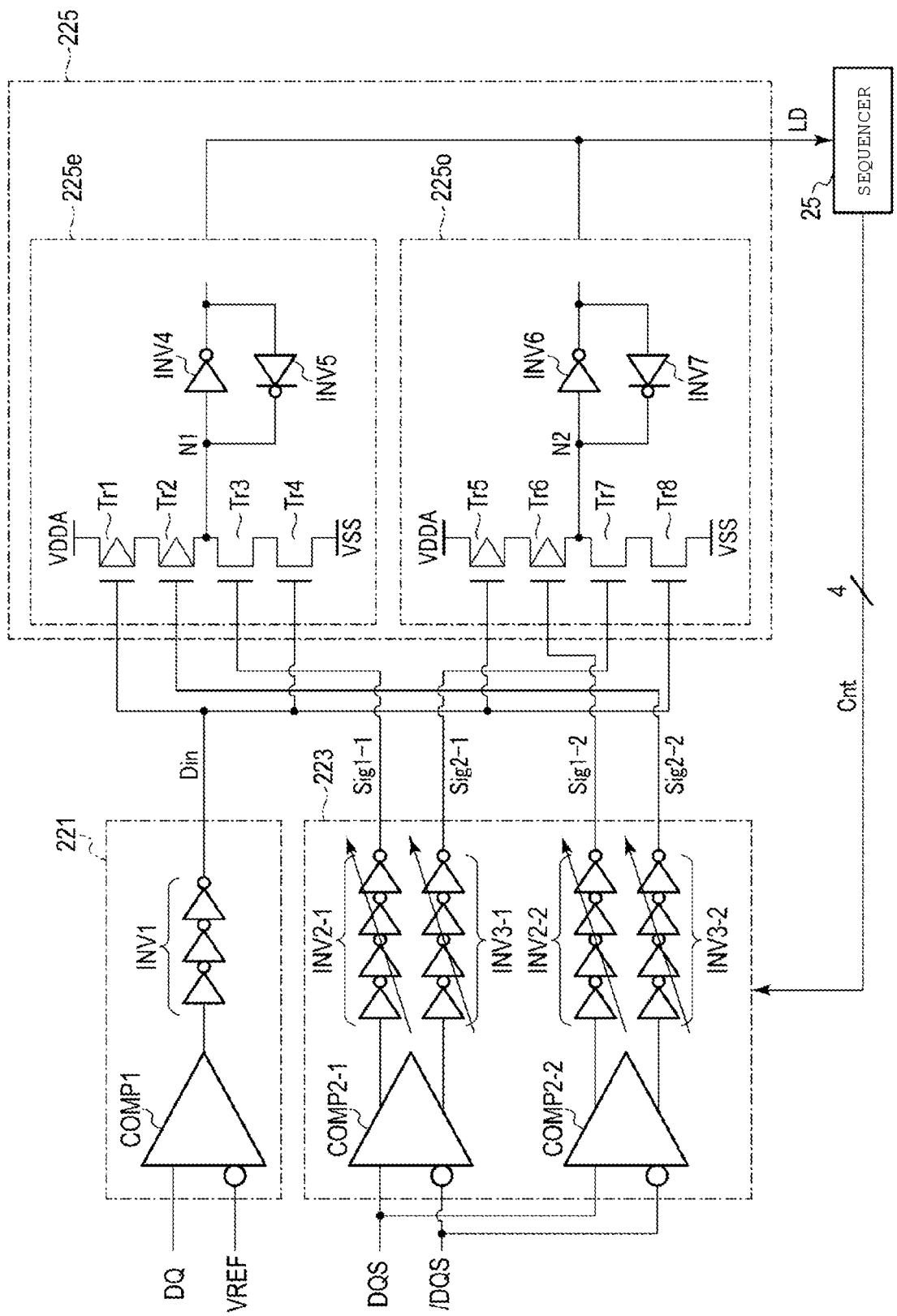
FIG. 12 is a circuit diagram of an input circuit and a data latch of a semiconductor memory device according to a modification example of the second embodiment.

FIG. 12 is a circuit diagram for explaining a configuration of an input circuit and a data latch of a semiconductor memory device according to a modification example of the second embodiment. FIG. 12 corresponds to FIG. 10 described in the second embodiment.

As illustrated in FIG. 12, when data LD latched in the data latches 225e and 225o is received, the sequencer 25 generates a control signal Cnt based on the data LD. The control signal Cnt is, for example, four independent control signals, and the four control signals are supplied to the inverter groups INV2-1, INV3-1, INV2-2, and INV3-2 in the input circuit 223, respectively.

Examples of an inverter of which a delay amount is variable include a cap bias voltage adjustment type delay circuit and a varicap type delay circuit. In the cap bias voltage adjustment type delay circuit, for example, a transistor functioning as a capacitor is connected between a plurality of inverters connected in series, and the delay amount is adjusted by changing the number of connections of the transistors according to the control signal Cnt. In the varicap type delay circuit, for example, the delay amount of the inverter is adjusted by changing the size of the transistors connected in series in the inverter according to the control signal Cnt.

With the configuration as described above, it is possible to adjust the timings of the edges of the signals Sig1-1, Sig2-1, Sig1-2, and Sig2-2 to any positions independently of each other.

2.4.2 Delay Amount Training Operation

Figure 13:
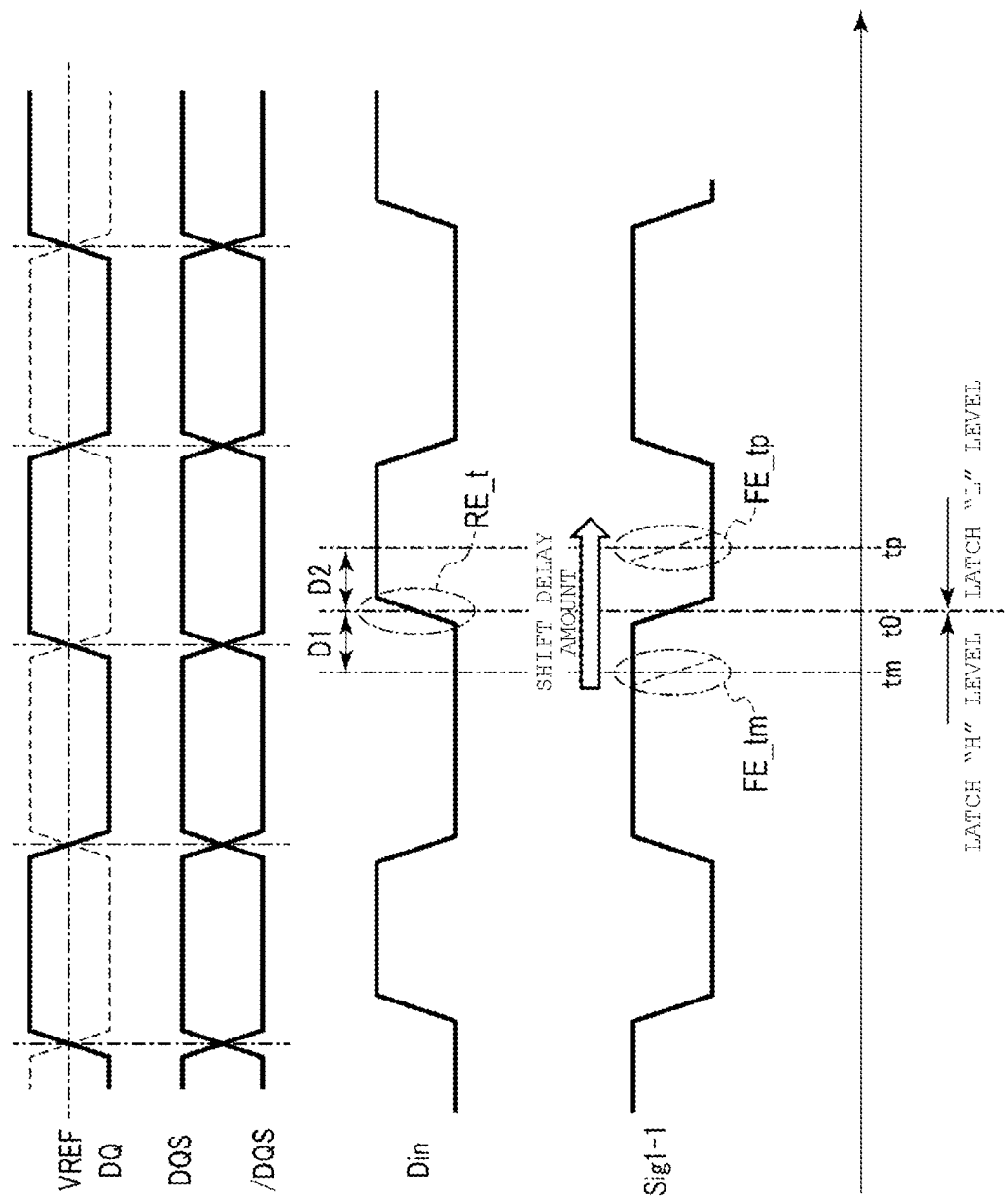
FIG. 13 is a timing chart for explaining a training operation in the semiconductor memory device according to the modification example of the second embodiment.

Next, a delay amount training operation in a semiconductor memory device according to the modification example of the second embodiment will be described with reference to FIG. 13. In FIG. 13, an example of a training operation for determining the delay amount of the signal Sig1-1 with respect to the signal Din is illustrated.

As illustrated in FIG. 13, during the training operation, the signal DQ and the signals DQS and /DQS are input with the same phase. With this, the signal Din output from the input circuit 221 and the signal Sig1-1 output from the input circuit 223 are output as signals whose phases are deviated by the delay amount of each input circuit. In the example of FIG. 13, a case where a rising edge RE_t of the signal Din is generated, for example, at time t0 is illustrated.

First, a case where the phase of the signal Sig1-1 is advanced with respect to the signal Din by a deviation amount D1 will be described. In this case, a falling edge FE_tm of the signal Sig1-1 is generated at time tm earlier by the deviation amount D1 than the rising edge RE_t of the signal Din. In this case, since the signal Din in the "L" level is strobed at the falling edge FE_tm, the "H" level is latched in the data latch 225e.

When data in the "H" level is received from the data latch 225e, for example, the sequencer 25 sends a control signal Cnt for gradually increasing the delay amount of the inverter group INV2-1, to the inverter group INV2-1 based on the data. With this, the phase of the signal Sig1-1 is gradually retarded and accordingly the timing of the falling edge of the signal Sig1-1 approaches the rising edge RE_t of the signal Din. While the timing of the falling edge of the signal Sig1-1 occurs earlier than the rising edge RE_t of the signal Din, the "H" level is continuously latched in the data latch 225e. For that reason, the sequencer 25 continues to send the control signal Cnt for increasing the delay amount of the inverter group INV2-1.

When an amount of increase in the delay amount with respect to the inverter group INV2-1 exceeds the deviation amount D1, the falling edge FE_t0 of the signal Sig1-1 will occur at a later timing than time t0 at which the rising edge RE_t of the signal Din occurs. Therefore, since the signal Din in the "H" level is strobed at the falling edge, the "L" level is latched in the data latch 225e. That is, at the point in time when the amount of increase in the delay amount with respect to the inverter group INV2-1 exceeds the deviation amount D1, latched data in the data latch 225e is inverted. When data of the "L" level is received from the data latch 225e, the sequencer 25 determines that the difference between the delay amounts of the signal Din and the signal Sig1-1 becomes "0", stores the increment D1 of the delay amount of the inverter group INV2-1 at that point in time, and ends the training operation.

Next, a case where the phase of the signal Sig1-1 is retarded with respect to the signal Din by a deviation amount D2 will be described. In this case, a falling edge FE_tp of the signal Sig1-1 is generated at time tp which is later than the rising edge RE_t of the signal Din by the deviation amount D2. In this case, since the signal Din in the "H" level is strobed at the falling edge FE_tp, the "L" level is latched in the data latch 225e.

When data in the "H" level is received from the data latch 225e, for example, the sequencer 25 sends the control signal Cnt for gradually decreasing the delay amount of the inverter group INV2-1 to the inverter group INV2-1 based on the data. With this, the phase of the signal Sig1-1 is gradually advanced and accordingly the timing of the falling edge of the signal Sig1-1 approaches the rising edge RE_t of the signal Din. While the timing of the falling edge of the signal Sig1-1 occurs later than the rising edge RE_t of the signal Din, the "L" level is continuously latched in the data latch 225e. For that reason, the sequencer 25 continues to send the control signal Cnt for decreasing the delay amount of the inverter group INV2-1.

When the amount of decrease in the delay amount with respect to the inverter group INV2-1 exceeds the amount D2, the falling edge of the signal Sig1-1 will occur at an earlier timing than time t0 at which the rising edge RE_t of the signal Din occurs. Therefore, since the signal Din in the "L" level is strobed at the falling edge, the "H" level is latched in the data latch 225e. That is, at the point in time when the amount of increase in the delay amount with respect to the inverter group INV2-1 exceeds the amount D2, latched data in the data latch 225e is inverted. When data of the "H" level is received from the data latch 225e, the sequencer 25 determines that the difference between the delay amounts of the signal Din and the signal Sig1-1 becomes "0", stores the decrement D2 of the delay amount of the inverter group INV2-1 at that point in time, and ends the training operation.

In the subsequent operations, the sequencer 25 applies the delay amount (D1 or D2) stored by the training operation to the inverter group INV2-1. With this, it is possible to reduce the difference in the delay amount between the input circuit 221 and the input circuit 223.

2.4.3 Effect According to Modification Example

According to the modification example of the second embodiment, the inverter groups INV2-1, INV3-1, INV2-2, and INV3-2 in the input circuit 223 are configured to have a delay amount which is variable. In the training operation, the sequencer 25 sends a signal capable of controlling the delay amount of each inverter based on the data latched in the data latches 225e and 225o. With this, the positions of the edges of the signals Sig1-1, Sig2-1, Sig1-2, and Sig2-2 which define the timing of latching data of the signal Din can be adjusted to desired positions.

Additionally, as described in the second embodiment, the deviation of the duty ratio generated when the signal Din is generated from the signal DQ can be canceled by adjusting the pull-down/pull-up characteristics in the comparators COMP2-1 and COMP2-2 in advance. However, for example, the delay amount between the signal Din and the signals Sig1-1, Sig2-1, Sig1-2, and Sig2-2 may change with the lapse of time. With this, the timing of latching data of the signal Din is deviated from the optimum position, which in turn may deteriorate the characteristics of the input signal.

According to the second embodiment, by executing the training operation, the phase difference between the input and output signals of the input circuit 221 and the phase difference between the input and output signals of the input circuit 223 can be made to coincide with each other. With this, even in a case where the delay amount is changed, the timing of latching data of the signal Din may be set to the optimum position, and eventually the characteristics of the input signal can be improved.

3. Third Embodiment

Next, a semiconductor memory device according to a third embodiment will be described. In the first embodiment and the second embodiment, the example in which the signals Sig1 and Sig2 are positioned at appropriate timings so as to follow variation of the duty ratio of the signal Din by adjusting the input circuit 223 is described. The third embodiment is different from the first embodiment and the second embodiment in that the variation of the duty ratio of the signal Din is prevented by further adjusting the input circuit 221 and the timings of the signals Sig1 and Sig2 are kept at appropriate positions. In the following, explanation of portions equivalent to the configuration and operation of the first embodiment will be omitted, and portions different from the configuration and operation of the first embodiment will mainly be described.

3.1 Configuration of Input Circuit and Data Latch

Figure 14:
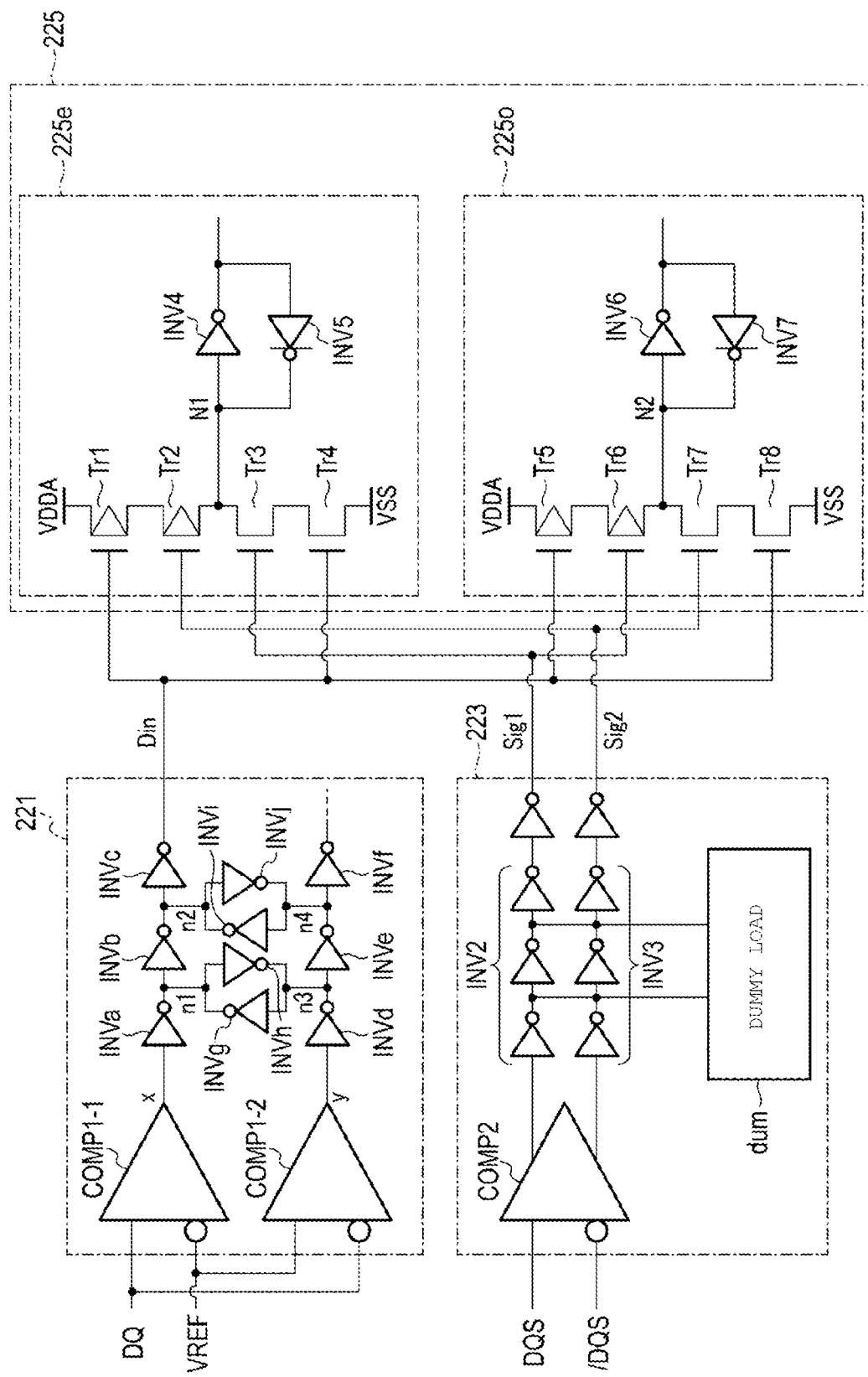
FIG. 14 is a circuit diagram of an input circuit and a data latch of a semiconductor memory device according to a third embodiment.

FIG. 14 is a circuit diagram for explaining a configuration of an input circuit and a data latch of a semiconductor memory device according to the third embodiment. FIG. 14 corresponds to FIG. 4 described in the first embodiment.

As illustrated in FIG. 14, the input circuit 221 includes comparators COMP1-1 and COMP1-2, and inverters INVa, INVb, INVc, INVd, INVe, INVf, INVg, INVh, INFi, and INVj.

The comparator COMP1-1 includes a first input terminal to which the signal DQ is supplied, a second input terminal to which the voltage VREF is supplied, and an output terminal connected to an input terminal of the inverter INVa. The comparator COMP1-1 has a configuration equivalent to that of the comparator COMP1 described in the first embodiment. For that reason, the comparator COMP1-1 can output a signal x having a phase inverse to that of the signal DQ to the inverter INVa.

The comparator COMP1-2 includes a first input terminal to which the voltage VREF is supplied, a second input terminal to which the signal DQ is supplied, and an output terminal connected to an input terminal of the inverter INVd. The comparator COMP1-2 has the configuration equivalent to that of the comparator COMP1 explained in the first embodiment, but the terminals to which the signal DQ and the voltage VREF are supplied are reversed. For that reason, the comparator COMP1-2 can output a signal y having the same phase as that of the signal DQ to the inverter INVd.

The output terminal of the inverter INVa, the input terminal of the inverter INVb, the output terminal of the inverter INVg, and the input terminal of the inverter INVh are commonly connected to a node n1.

The output terminal of the inverter INVb, the input terminal of the inverter INVc, the output terminal of the inverter INVi, and the input terminal of the inverter INVj are commonly connected to a node n2.

The output terminal of the inverter INVd, the input terminal of the inverter INVe, the input terminal of the inverter INVg, and the output terminal of the inverter INVh are commonly connected to a node n3.

The output terminal of the inverter INVe, the input terminal of the inverter INVf, the input terminal of the inverter INVi, and the output terminal of the inverter INVj are commonly connected to a node n4.

From the output terminal of the inverter INVc, the signal Din is output.

As described above, a larger number of inverters than the inverter group INV1 described in the first embodiment are connected to the input circuit 221. For that reason, the delay amount of the signal Din output from the input circuit 221 according to the third embodiment becomes larger than that of the first embodiment. For that reason, the input circuit 223 further includes a dummy load dum.

The dummy load dum is connected to the inverter groups INV2 and INV3, and for example, it is possible to apply loads equivalent to the inverters INVa to INVj to output paths of the signals Sig1 and Sig2.

3.2 Operation of Input Circuit

Figure 15:
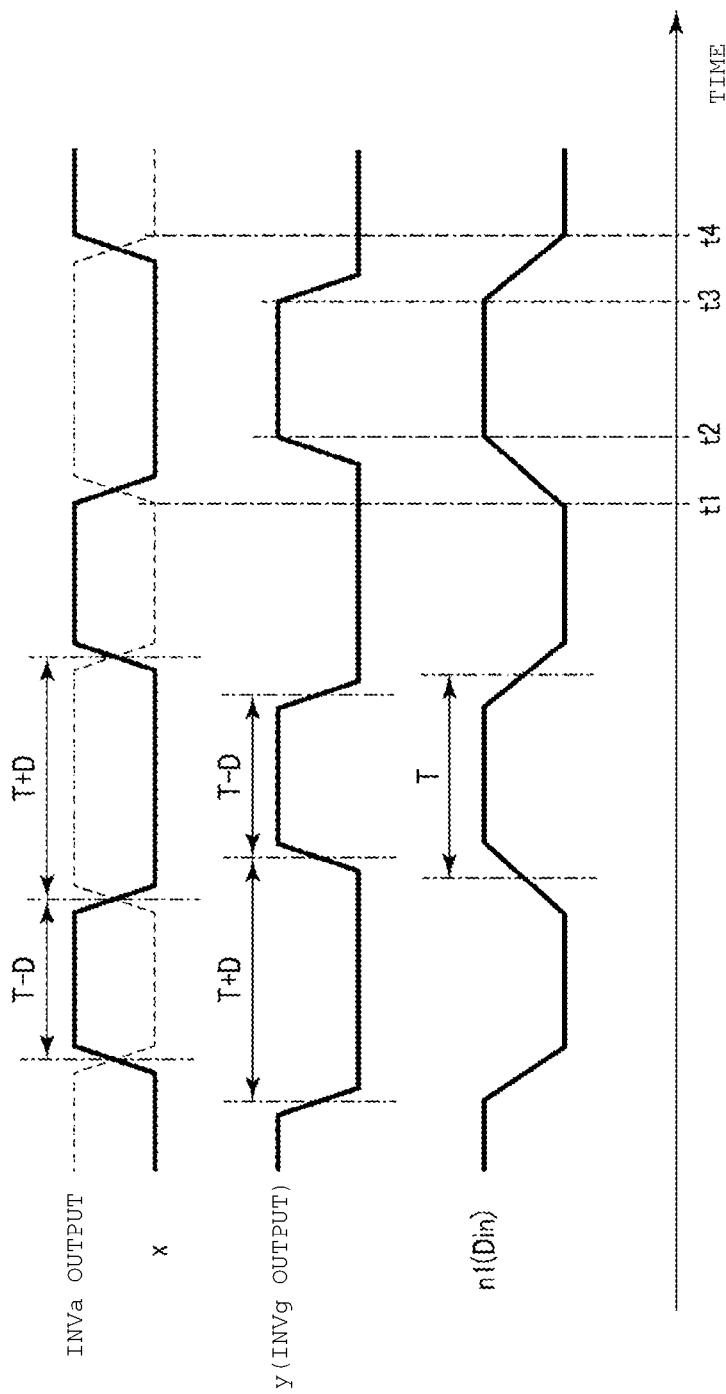
FIG. 15 is a timing chart for explaining an input operation in the semiconductor memory device according to the third embodiment.

FIG. 15 is a circuit diagram for explaining the operation of the input circuit of the semiconductor memory device according to the third embodiment. In FIG. 15, waveforms of various signals generated by the input circuit 221 are illustrated.

As illustrated in FIG. 15, the comparator COMP1-1 outputs, for example, a signal x having a duty ratio (for example, of which duty ratio is (50−X) %) at which the rising period is (T−D) and the falling period is (T+D) based on the signal Din and the voltage VREF. In this case, the comparator COMP1-2 outputs a signal having a phase inverse to that of the signal x. That is, the comparator COMP1-2 outputs a signal y having a duty ratio (for example, of which duty ratio is (50+X) %) at which the rising period is (T+D) and the falling period is (T−D).

The inverter INVa has a function of generating a complementary signal of the signal x. For that reason, the inverter INVa tries to supply a signal having a phase inverse to that of the signal x and having a duty ratio of (50+X) % to the node n1.

On the other hand, the inverter INVd has a function of generating a complementary signal of the signal y. The inverter INVg has a function of generating a complementary signal of a signal output from the inverter INVd. For that reason, the inverter INVg tries to supply a signal equivalent to the signal y to the node n1.

At the node n1, a signal in which the signal output from the inverter INVa and the signal output from the inverter INVg are added together is generated. With this, the rising edge of the signal at the node n1 has, for example, a shape that starts rising at rising start time t1 of the output signal from the inverter INVa and ends rising at rising end time t2 of the output signal from the inverter INVg. The falling edge of the signal at the node n1 has, for example, a shape that starts falling at falling start time t3 of the output signal from the inverter INVg and ends falling at falling end time t4 of the output signal from the inverter INVa. For that reason, a signal (that is, of which duty ratio is 50%) in which both the rising period and the falling period are the period T is supplied to the node n1. A similar operation also works at node n2. Accordingly, a signal having a duty ratio of 50% is supplied as the signal Din.

3.3 Effect of Third Embodiment

According to the third embodiment, to the node n1, two signals having the same phase and the duty ratios inverted from each other are supplied. The signal of the node n1 is shaped so that the duty ratio is 50%, in order to match with the two signals. With this, the duty ratio of the signal Din generated based on a comparison result between the signal DQ and the voltage VREF can be brought close to 50%. For that reason, it is possible to prevent the deviation of the duty ratio of the signal Din with respect to the signal DQ, and eventually it is possible to reduce the amount of correction required for the input circuit 223 to follow the characteristics of the input circuit 221.

4. Fourth Embodiment

Next, a semiconductor memory device according to a fourth embodiment will be described. In the first to third embodiments, a case where the signals Sig1 and Sig2 are generated by comparing the signals DQS and /DQS is described. In the fourth embodiment, a case where signals Sig1 and Sig2 are generated by comparing signal /DQS and voltage VREF while comparing signal DQS and voltage VREF will be described.

In the following description, description of portions equivalent to the configuration and operation of the first embodiment will be omitted, and portions different from the configuration and operation of the first embodiment will mainly be described.

4.1 Configuration of Input Circuit and Data Latch

Figure 16:
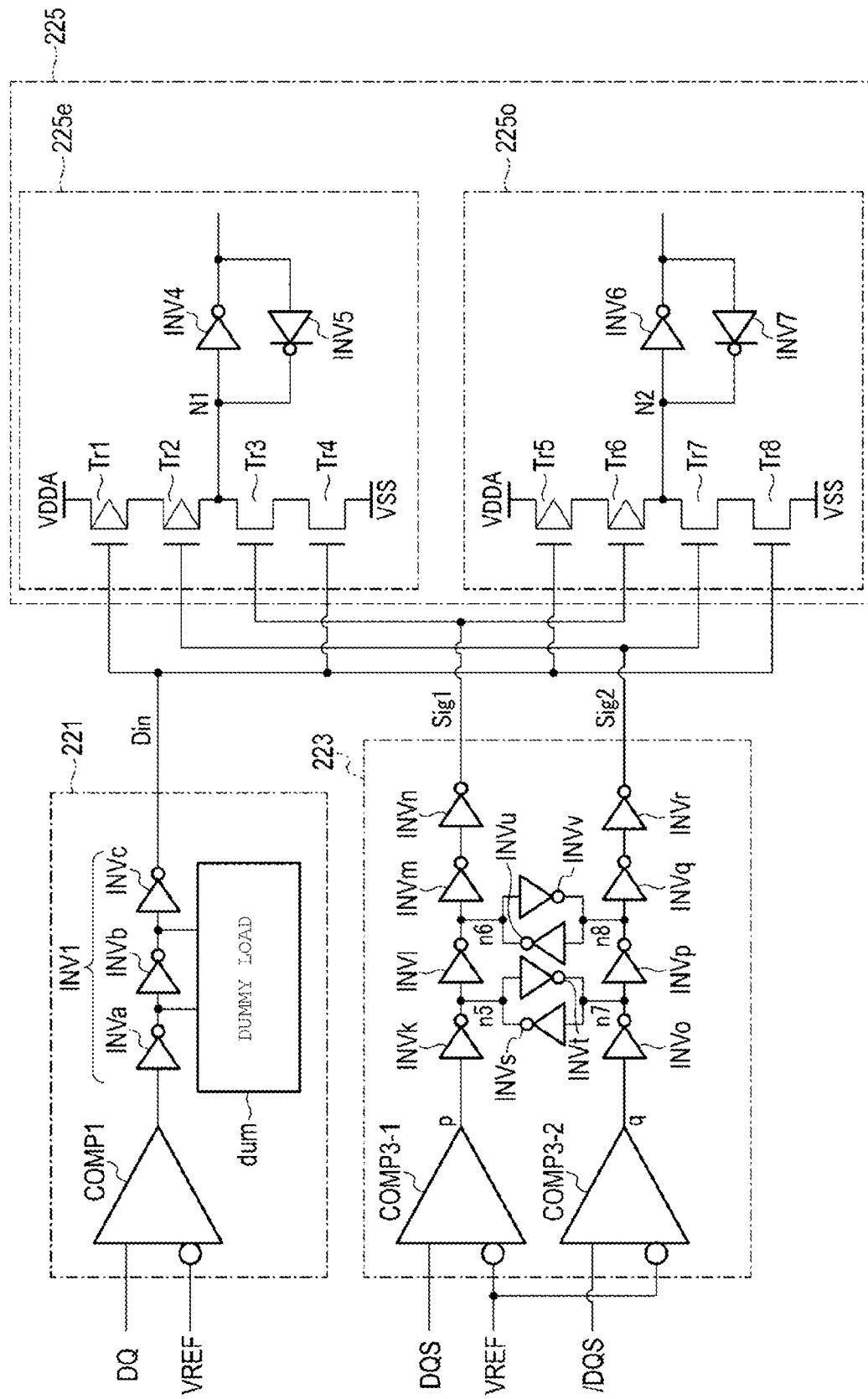
FIG. 16 is a circuit diagram of an input circuit and a data latch of a semiconductor memory device according to a fourth embodiment.

FIG. 16 is a circuit diagram for explaining a configuration of an input circuit and a data latch of a semiconductor memory device according to a fourth embodiment. FIG. 16 corresponds to FIG. 4 described in the first embodiment.

As illustrated in FIG. 16, the input circuit 223 includes comparators COMP3-1 and COMP3-2, and inverters INVk, INVl, INVm, INVn, INVo, INVp, INVq, INVr, INVs, INVt, INVu, and INVv.

The comparator COMP3-1 includes a first input terminal to which the signal DQS is supplied, a second input terminal to which the voltage VREF is supplied, and an output terminal connected to an input terminal of the inverter INVk. The comparator COMP3-1 has a configuration equivalent to that of the comparator COMP1. For that reason, the comparator COMP3-1 can output a signal p having a phase inverse to that of the signal DQS to the inverter INVk.

The comparator COMP3-2 includes a first input terminal to which the signal /DQS is supplied, a second input terminal to which the voltage VREF is supplied, and an output terminal connected to an input terminal of the inverter INVo. The comparator COMP3-2 has a configuration equivalent to that of the comparator COMP3-1. For that reason, the comparator COMP3-2 can output a signal q having a phase inverse to that of the signal /DQS to the inverter INVo.

The output terminal of the inverter INVk, the input terminal of the inverter INVl, the output terminal of the inverter INVs, and the input terminal of the inverter INVt are commonly connected to a node n5.

The output terminal of the inverter INVl, the input terminal of the inverter INVm, the output terminal of the inverter INVu, and the input terminal of the inverter INVv are commonly connected to a node n6.

The output terminal of the inverter INVo, the input terminal of the inverter INVp, the input terminal of the inverter INVs, and the output terminal of the inverter INVt are commonly connected to a node n7.

The output terminal of the inverter INVp, the input terminal of the inverter INVq, the input terminal of the inverter INVu, and the output terminal of the inverter INVv are commonly connected to a node n8.

The inverter INVn includes an input terminal connected to an output terminal of the inverter INVm and an output terminal for outputting the signal Sig1. The inverter INVr includes an input terminal connected to an output terminal of the inverter INVq and an output terminal for outputting the signal Sig2.

As described above, a larger number of inverters than the inverter groups INV2 and INV3 described in the first embodiment are connected to the input circuit 223. For that reason, the delay amount of the signal Din output from the input circuit 223 according to the fourth embodiment becomes larger than that of the first embodiment. For that reason, the input circuit 221 further includes the dummy load dum.

The dummy load dum is connected to the inverter group INV1, and for example, it is possible to apply loads equivalent to the inverters INVk to INVv to output paths of the signal Din.

4.2 Operation of Input Circuit

Figure 17:
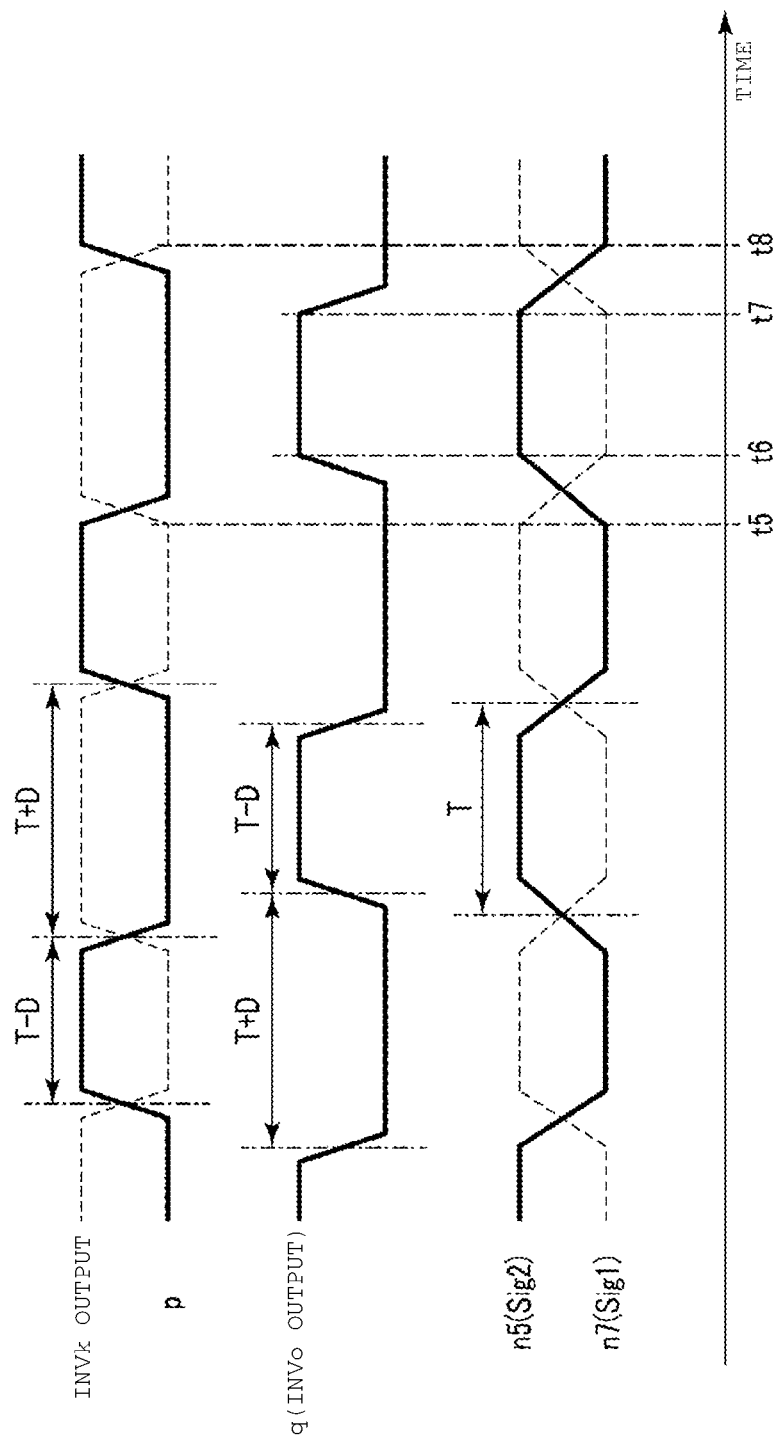
FIG. 17 is a timing chart for explaining an input operation in the semiconductor memory device according to the fourth embodiment.

FIG. 17 is a circuit diagram for explaining the operation of the input circuit of the semiconductor memory device according to the fourth embodiment. In FIG. 17, waveforms of various signals generated by the input circuit 223 are illustrated.

As illustrated in FIG. 17, the comparator COMP3-1 outputs, for example, a signal p having a duty ratio (for example, of which duty ratio is (50–X) %) at which the rising period is (T–D) and the falling period is (T+D) based on the signal DQS and the voltage VREF. In this case, the comparator COMP3-2 outputs a signal having a phase inverse to that of the signal q. That is, the comparator COMP3-2 outputs the signal q having a duty ratio (for example, of which duty ratio is (50+X) %) at which the rising period is (T+D) and the falling period is (T–D).

The inverter INVk has a function of generating a complementary signal of the signal p. For that reason, the inverter INVk tries to supply a signal having a phase inverse to that of the signal p and having a duty ratio of (50+X) % to the node n5.

On the other hand, the inverter INVo has a function of generating a complementary signal of the signal q. The inverter INVs has a function of generating a complementary signal of a signal output from the inverter INVo. For that reason, the inverter INVs tries to supply a signal equivalent to the signal q to the node n5.

At the node n5, a signal in which the signal output from the inverter INVk and the signal output from the inverter INVs are added together, is generated. With this, the rising edge of the signal at the node n5 has, for example, a shape that starts rising at rising start time t5 of the output signal from the inverter INVk and ends rising at rising end time t6 of the output signal from the inverter INVs. The falling edge of the signal at the node n5 has, for example, a shape that starts falling at falling start time t7 of the output signal from the inverter INVs and ends falling at falling end time t8 of the output signal from the inverter INVk. For that reason, a signal (that is, of which duty ratio is 50%) in which both the rising period and the falling period are the period T is supplied to the node n5. A similar operation also works at the node n6. Accordingly, a signal having a duty ratio of 50% is supplied to the signal Sig1.

Similarly, at the node n7, a signal in which the signal output from the inverter INVo and the signal output from the inverter INVt are added together, is generated. A similar operation also works at the node n8. Accordingly, a signal having a duty ratio of 50% is supplied to the signal Sig2.

4.3 Effect According to Fourth Embodiment

According to the fourth embodiment, to the nodes n5 and n7, two signals having the same phase and duty ratios inverted from each other are supplied. The signals of the nodes n5 and n7 are shaped so that the duty ratio is 50% in order to match with the two signals. With this, both the duty ratio of the signal Sig1 generated based on the comparison result between the signal DQS and the voltage VREF and the duty ratio of the signal Sig2 generated based on the comparison result between the signal /DQS and the voltage VREF can be brought close to 50%. Further, even in a case where the duty ratio of the signals DQS and /DQS have already deviated from 50%, the duty ratio of the signals Sig1 and Sig2 can be brought close to 50%.

In the example illustrated in FIG. 16, the case where the delay amount with the input circuit 223 is adjusted by connecting the dummy load dum to the inverter group INV1 of the input circuit 221 is described, but the present disclosure is not limited thereto. For example, as described with reference to FIG. 14 in the third embodiment, the input circuit 221 may include the comparators COMP1-1 and COMP1-2 and the inverters INVa to INVj. With this, the duty ratio of the signal Din generated based on the comparison result between the signal DQ and the voltage VREF can be brought close to 50%. For that reason, it is possible to prevent the deviation of the duty ratio of the signal Din with respect to the signal DQ, which in turn makes it possible to improve both the characteristics of the input circuit 221 and the characteristics of the input circuit 223.

4.4 Modification Example

In the fourth embodiment, a case where the signals Sig1 and Sig2 to be generated are brought close to 50% while comparing each of the signals DQS and /DQS with the voltage VREF is described, but the present disclosure is not limited thereto.

Figure 18:
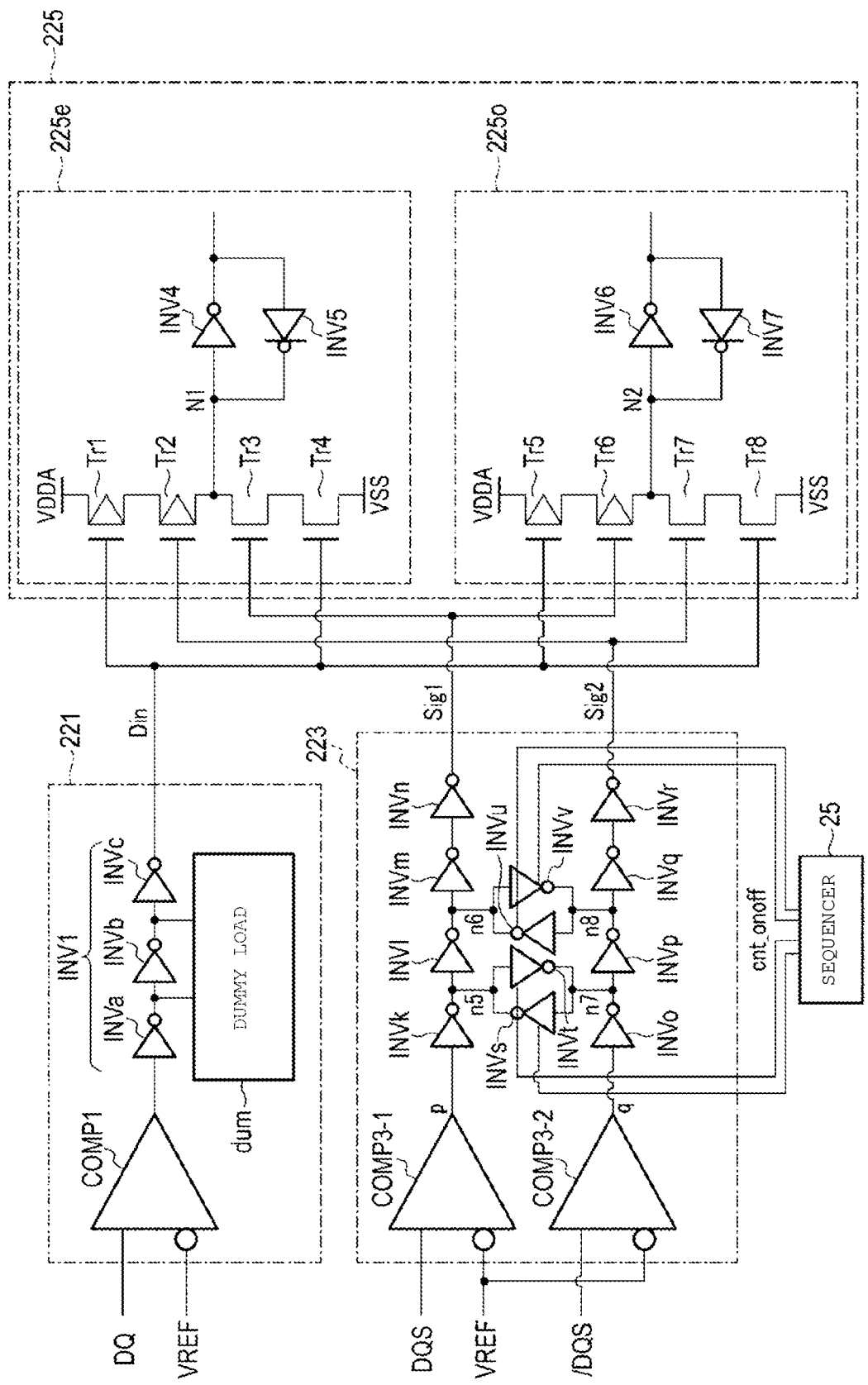
FIG. 18 is a circuit diagram of an input circuit and a data latch of a semiconductor memory device according to a modification example of the fourth embodiment.

FIG. 18 is a circuit diagram for explaining a configuration of an input circuit and a data latch according to a modification example of the fourth embodiment.

As illustrated in FIG. 18, each of the inverters INVs to INVv is configured so that the connection between a wiring for outputting the signal Sig1 and a wiring for outputting the signal Sig2 can be switched on and off, based on a control signal cnt_onoff sent from the sequencer 25. More specifically, for example, each of the inverters INVs and INVt includes a tri-state inverter that can electrically disconnect the nodes n5 and n7 based on the control signal cnt_onoff. Each of the inverters INVu and INVv includes a tri-state inverter that can electrically disconnect the nodes n6 and n8 based on the control signal cnt_onoff.

With the configuration as described above, in a case where the nodes n5 and n7 are electrically connected and the nodes n6 and n8 are electrically connected via the inverters INVs to INVv, the input circuit and the data latch can function similarly to the configuration described in the fourth embodiment. As the case where the signals Din, Sig1, and Sig2 of which duty ratios are adjusted are used, for example, a case where the setup time and the hold time are defined based on the intersection point of the signal DQ and the voltage VREF and the intersection point of the signal DQS and the signal /DQS is assumed.

Further, in a case where the nodes n5 and n7 are electrically disconnected and the nodes n6 and n8 are electrically disconnected via the inverters INVs to INVv, a configuration in which the signals Din, Sig1, and Sig2 are generated based on a comparison result with the voltage VREF may be adopted. As a case where the signals Din, Sig1, and Sig2 are used with the voltage VREF as a reference, for example, a case where the setup time and the hold time are defined based on the intersection of each of the signals DQ, DQS, and /DQS and the voltage VREF is assumed.

5. Fifth Embodiment

Next, a semiconductor memory device according to a fifth embodiment will be described. In the first to fourth embodiments, the configuration for adjusting the timing between the signal Din and the signals DQS and /DQS is described. The fifth embodiment is different from the first to fourth embodiments in that, in the case where the intersection point of two signals complementary to each other is input in a state where they are deviated from the voltage VREF, the two signals are adjusted to intersect with the voltage VREF. In the following, explanation of portions equivalent to the configuration and operation of the first embodiment will be omitted, and portions different from the configuration and operation of the first embodiment will mainly be described.

5.1 Details of Configuration of Input Circuit

Figure 19:
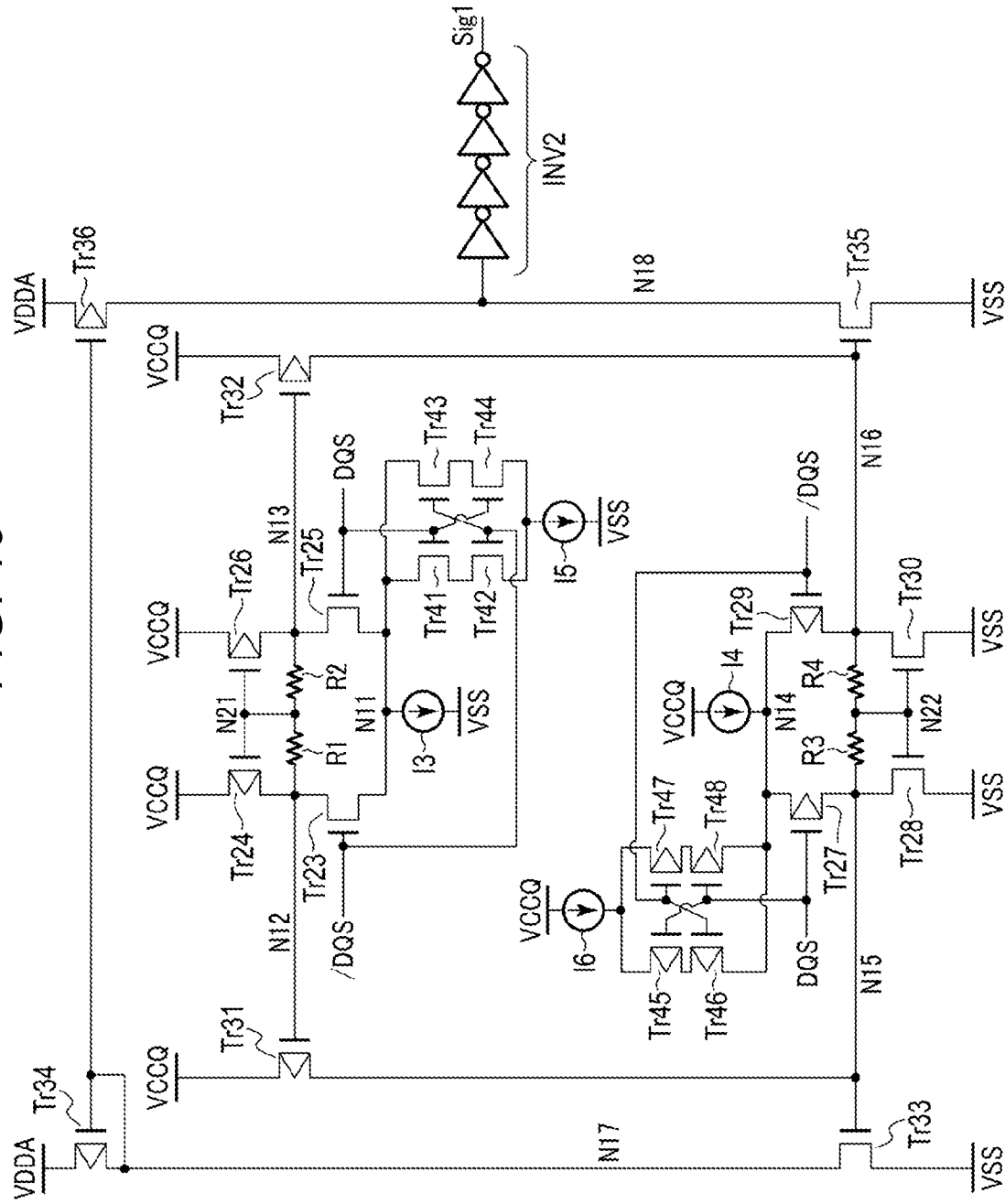
FIG. 19 is a circuit diagram of an input circuit for a strobe signal of a semiconductor memory device according to a fifth embodiment.

Details of the configuration of the input and output circuit according to the fifth embodiment will be described with reference to FIG. 19. FIG. 19 is a circuit diagram for explaining a configuration of an input circuit for strobe signals DQS and /DQS in a semiconductor memory device according to the fifth embodiment. FIG. 19 corresponds to FIG. 6 described in the first embodiment. In FIG. 19, for simplicity, a portion related to the signal Sig1 among the signals output from the comparator COMP2 is illustrated.

As illustrated in FIG. 19, the comparator COMP2 includes transistors Tr23 to Tr36 (does not include the transistor Tr36a) and the current sources 13 and 14 in the configuration of the comparator COMP2 described in the first embodiment. The comparator COMP2 further includes transistors Tr41, Tr42, Tr43, Tr44, Tr45, Tr46, Tr47, and Tr48, resistors R1, R2, R3, and R4, and current sources 15 and 16. The transistors Tr41 to Tr44 are, for example, N-type transistors, and the transistors Tr45 to Tr48 are, for example, P-type transistors.

Each of the set including the transistors Tr41 to Tr44 and the current source I5 and the set including the transistors Tr45 to Tr48 and the current source I6 forms a correction circuit.

The transistor Tr41 includes a first terminal connected to a node N11, a second terminal connected to the first terminal of the transistor Tr42, and a gate to which the signal DQS is supplied. The transistor Tr42 includes a second terminal connected to an input terminal of the current source I5 and a gate to which the signal /DQS is supplied. The transistor Tr43 includes a first terminal connected to the node N11, a second terminal connected to a first terminal of the transistor Tr44, and a gate to which the signal /DQS is supplied. The transistor Tr44 includes a second terminal connected to an input terminal of the current source I5 and a gate to which the signal DQS is supplied. The current source I5 includes an output terminal to which the voltage VSS is supplied.

Each of the transistors Tr41 to Tr44 are configured to be turned ON in a case where a voltage larger than the voltage VREF is supplied to a gate thereof and to be turned OFF in a case where a voltage smaller than the voltage VREF is supplied to the gate.

The transistor Tr45 includes a first terminal connected to an output terminal of the current source I6, a second terminal connected to a first terminal of the transistor Tr46, and a gate to which the signal DQS is supplied. The transistor Tr46 includes a second terminal connected to the node N14 and a gate to which the signal /DQS is supplied. The transistor Tr47 includes a first terminal connected to an output terminal of the current source I6, a second terminal connected to a first terminal of the transistor Tr48, and a gate to which the signal /DQS is supplied. The transistor Tr48 includes a second terminal connected to the node N14 and a gate to which the signal DQS is supplied. The current source I6 includes an input terminal to which the voltage VCCQ is supplied.

It is preferable that each of the transistors Tr45 to Tr48 be configured to be turned ON in a case where a voltage smaller than the voltage VREF is supplied to a gate thereof and to be turned OFF in a case where a voltage larger than the voltage VREF is supplied to the gate.

The resistor R1 includes a first terminal connected to the node N12 and a second terminal connected to a node N21. The resistor R2 includes a first terminal connected to the node N13 and a second terminal connected to the node N21. The gates of the transistors Tr24 and Tr26 are commonly connected to the node N21, and are connected to the nodes N12 and N13 via the resistors R1 and R2, respectively.

The resistor R3 includes a first terminal connected to the node N15 and a second terminal connected to a node N22. The resistor R4 includes a first terminal connected to the node N16 and a second terminal connected to the node N22. The gates of the transistors Tr28 and Tr30 are commonly connected to the node N22, and are connected to the nodes N15 and N16 via the resistors R3 and R4, respectively.

With the configuration as described above, in a case where the value of the voltage at the intersection point of the signal DQS and the signal /DQS is different from the voltage VREF, timing deviation of the edge of the signal Sig1 can be corrected.

5.2 Operation of Input Circuit

Figure 20:
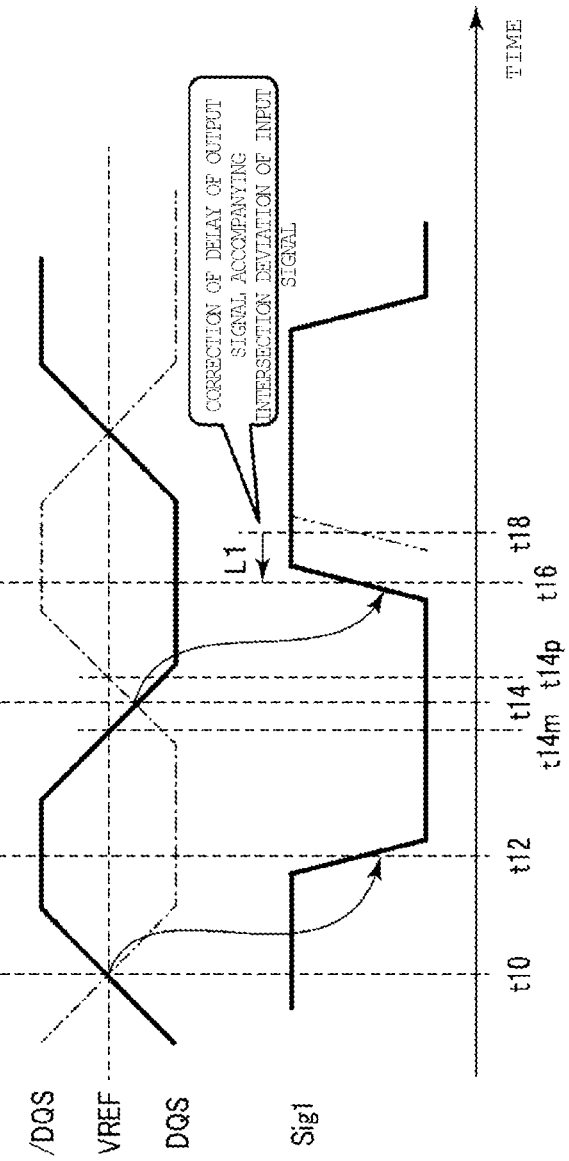
FIGS. 20A and 20B are timing charts for explaining an input operation in the semiconductor memory device according to the fifth embodiment.

FIGS. 20A and 20B are timing charts for explaining the operation of the input circuit of the semiconductor memory device according to the fifth embodiment. FIGS. 20A and 20B illustrate the influence of deviation between the intersection point with the signals DQS and /DQS and the voltage VREF on the timing of the edge of the signal Sig1. More specifically, in FIG. 20A, the waveform of the signal Sig1 in a case where the signals DQS and /DQS cross at the voltage VREF is illustrated. In FIG. 20B, the waveform of the signal Sig1 in a case where the signals DQS and /DQS cross at a position different from the voltage VREF is illustrated.

First, the case where the signals DQS and /DQS cross at the voltage VREF will be described with reference to FIG. 20A.

As illustrated in FIG. 20A, at time t10, the rising edge of the signal DQS and the falling edge of the signal /DQS cross at the voltage VREF. Then, the signal Sig1 falls at time t12.

At time t14, the falling edge of the signal DQS crosses the rising edge of the signal /DQS at the voltage VREF. Then, the signal Sig1 rises at time t16.

As such, in a case where the signals DQS and /DQS cross at the voltage VREF, the signal Sig1 can have an ideal waveform.

Next, a case where the signals DQS and /DQS cross at a voltage lower than the voltage VREF will be described with reference to FIG. 20B.

As illustrated in FIG. 20B, at time t10, the normal signals DQS and /DQS are input to the comparator COMP2. With this, at time t10, the rising edge of the signal DQS and the falling edge of the signal /DQS cross at the voltage VREF. For that reason, the signal Sig1 falls at time t12 as in the case of FIG. 20A.

On the other hand, in the vicinity of time t14, the falling edge of the signal DQS crosses the voltage VREF at time t14m before time t14 and the rising edge of the signal /DQS crosses the voltage VREF at time t14p after time t14. For that reason, at time t14, the rising edge of the signal DQS and the falling edge of the signal /DQS cross at a voltage lower than the voltage VREF. In this case, an overlapping period of a period during which the signal DQS transitions from the "H" level to the "L" level and a period during which the signal /DQS transitions from the "L" level to the "H" is shorter than in the case of FIG. 20A. With this, the ability of the comparator COMP2 to perform differential amplification can be decreased and the delay time until the signal Sig1 rises can be increased. Accordingly, the signal Sig1 can rise at time t18 delayed by a period L1 from time t16. The comparator COMP2 can correct the delay of the rising edge.

At and after time t14m, the transistors Tr45 and Tr48 are turned ON by supplying a voltage lower than the voltage VREF. The transistors Tr46 and Tr47 are turned ON by supplying a voltage lower than the voltage VREF until time t14p. With this, a current path from a current source I6 to the node N14 is formed in a period from time t14m to time t14p. For that reason, the ability of the comparator COMP2 to cause the node N18 to go to the "H" level is increased in this period, and the delay time until the signal Sig1 rises can be shortened.

By operating as described above, the signal Sig1 can rise at time t16.

5.3 Effect According to Fifth Embodiment

According to the fifth embodiment, the comparator COMP2 includes the transistors Tr41 to Tr48 that configures a correction circuit. In a case where the signals DQS and /DQS are larger than the voltage VREF, all of the transistors Tr41 to Tr44 are turned ON. In this case, a current path is formed between the node N11 and the current source IS, and the amount of electric charges to be charged to and discharged from the node N12 or N13 increases. The transistors Tr45 to Tr48 are all turned ON in a case where the voltages of signals DQS and /DQS are both lower than the voltage VREF. In this case, a current path is formed between the current source I6 and the node N14, and the amount of electric charges to be charged to and discharged from the node N15 or N16 increases. With this, the delay time of the signal to be supplied to the node N18 is shortened. For that reason, it is possible to reduce the delay amount of the signal Sig1 generated due to the deviation of the intersection point of the signals DQS and /DQS from the voltage VREF.

6. Sixth Embodiment

Next, a semiconductor memory device according to a sixth embodiment will be described. In the fifth embodiment, the case where each of the threshold voltages of the transistors Tr41 to Tr44 and Tr45 to Tr48 in the correction circuit are equal to the voltage VREF is described. The sixth embodiment is different from the fifth embodiment in that the delay amount of the signal Sig1 can be properly corrected in a case where the threshold voltages of the transistors are deviated from the voltage VREF.

In the following description, the description of the portions equivalent to the configuration and operation of the fifth embodiment will be omitted, and the portions different from the configuration and operation of the fifth embodiment will mainly be described.

6.1 Details of Configuration of Input Circuit

Figure 21:
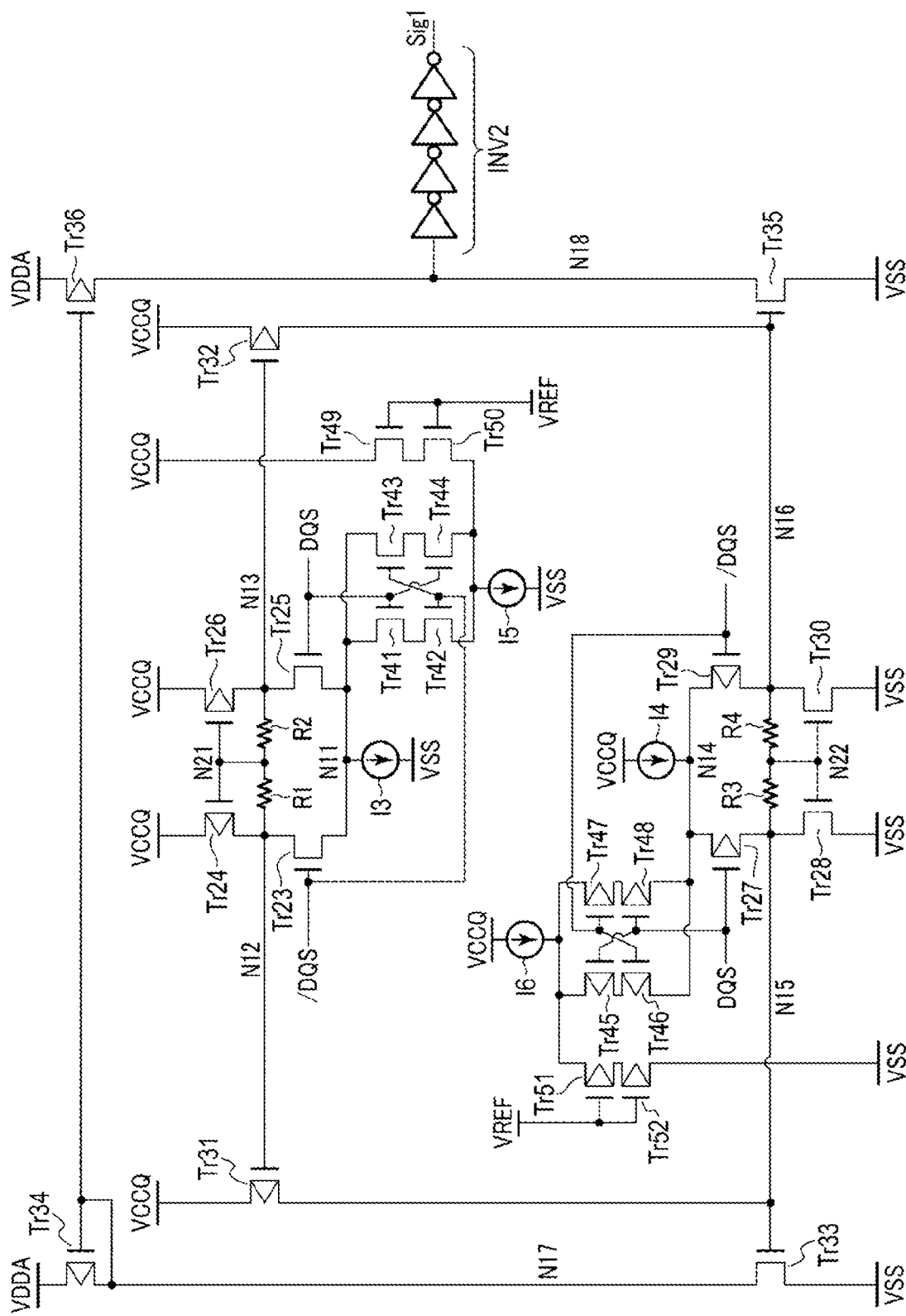
FIG. 21 is a circuit diagram of an input circuit for a strobe signal of a semiconductor memory device according to a sixth embodiment.

FIG. 21 is a circuit diagram for explaining a configuration of an input circuit of the strobe signals DQS and /DQS according to a sixth embodiment. FIG. 21 corresponds to FIG. 19 described in the fifth embodiment.

As illustrated in FIG. 21, the comparator COMP2 further includes transistors Tr49, Tr50, Tr51, and Tr52. The transistors Tr49 and Tr50 are, for example, N-type transistors, and the transistors Tr51 and Tr52 are, for example, P-type transistors.

The transistor Tr49 includes a first terminal to which the voltage VCCQ is supplied, a second terminal connected to a first terminal of the transistor Tr50, and a gate to which the voltage VREF is supplied. The transistor Tr50 includes a second terminal connected to the input terminal of the current source I5 and a gate to which the voltage VREF is supplied.

The transistor Tr51 includes a first terminal connected to the output terminal of the current source I6, a second terminal connected to a first terminal of the transistor Tr52, and a gate to which the voltage VREF is supplied. The transistor Tr52 includes a second terminal to which the voltage VSS is supplied and a gate to which the voltage VREF is supplied.

With the configuration as described above, in the case where the threshold voltages of the various transistors in the correction circuit are deviated from the voltage VREF, it is possible to correct timing deviation of the edge of the signal Sig1.

6.2 Operation of Input Circuit

Figure 22:
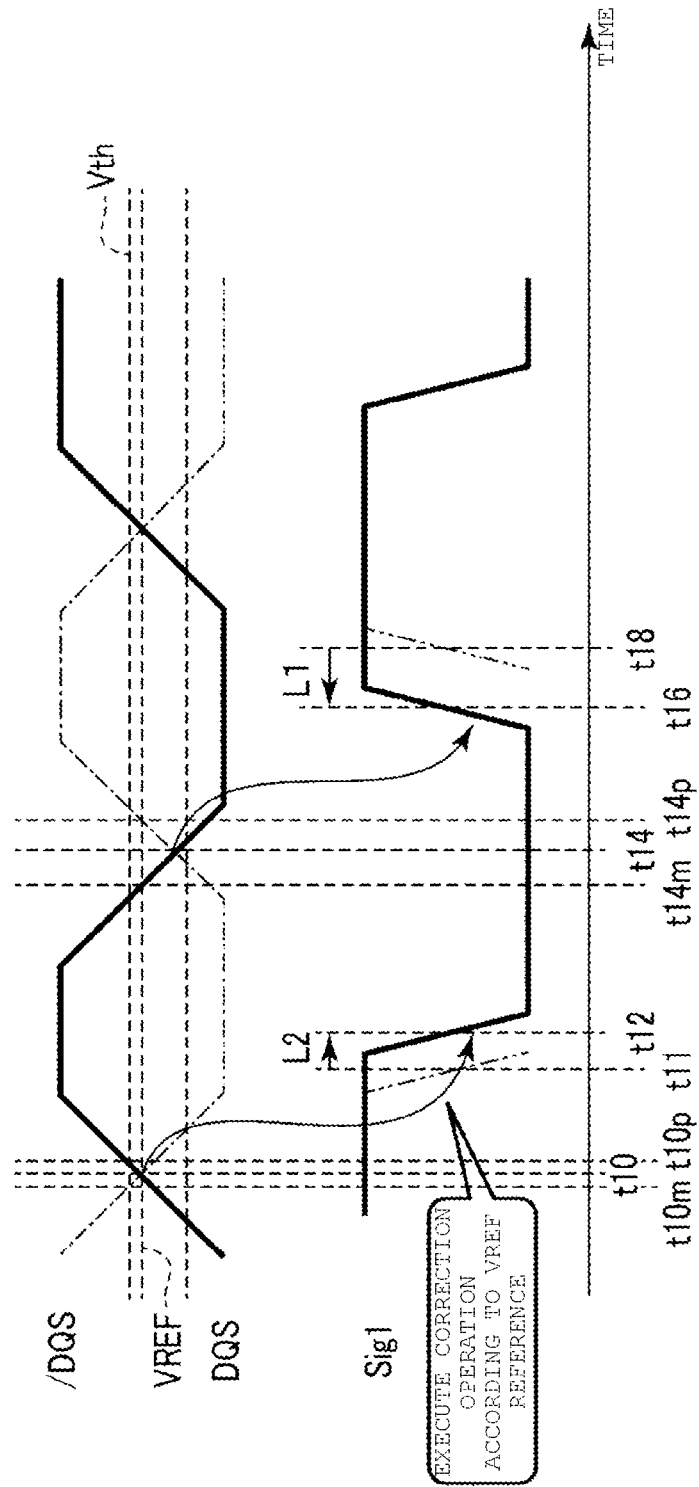
FIG. 22 is a timing chart for explaining an input operation in the semiconductor memory device according to the sixth embodiment.

FIG. 22 is a timing chart for explaining the operation of an input circuit of a semiconductor memory device according to a sixth embodiment. FIG. 22 illustrates the influence of deviation between a threshold voltage Vth of each of the transistors Tr41 to Tr48 in the correction circuit and the voltage VREF on the timing of the edge of the signal Sig1. In the example of FIG. 22, the case where the threshold voltage Vth is larger than the voltage VREF is illustrated.

As illustrated in FIG. 22, in the vicinity of time t10, the falling edge of the signal /DQS crosses the threshold voltage Vth at time t10m before time t10 and the rising edge of the signal DQS crosses the threshold voltage Vth and at time t10p later than time t10. For that reason, at time t10, although the rising edge of the signal DQS crosses the falling edge of the signal /DQS at the voltage VREF, the transistors Tr45 to Tr48 are turned ON in a period from time t10m to time t10p. With this, a current path from the current source I6 to the node N14 is formed in a period from time t10m to time t10p and the ability of the comparator COMP2 to cause the node N18 to go to the "L" level can be increased in the period. Accordingly, the signal Sig1 can fall at time t11 earlier by a period L2 than time t12. The comparator COMP2 can correct early fall of the falling edge.

The voltage VREF is supplied to the gates of the transistors Tr51 and Tr52. With this, the transistors Tr51 and Tr52 are always in an ON state and form a current path from the current source I6 to the voltage VSS. The on-resistance of the current path corresponds to the voltage VREF and is constant irrespective of the signals DQS and /DQS.

In a case where either one of the voltages of the signals DQS and /DQS input to the gates of the transistors Tr45 to Tr48 is larger than the voltage VREF, the on-resistances of the transistors Tr51 and Tr52 are smaller than the on-resistances of the transistors Tr45 to Tr48. In this case, the current flowing through the current source I6 is dominated by the current flowing through the current path through the transistors Tr51 and Tr52. For that reason, even when the transistors Tr45 to Tr48 are in the ON state, in a case (that is, a period from time t10m to time t10p) where either one of the signals DQS and /DQS is larger than the voltage VREF, the comparator COMP2 switches the node N18, an increase in the ability of the comparator COMP2 to cause the node N18 to go to the "L" level is prevented. Accordingly, the comparator COMP2 can output the signal Sig1 that falls at time t12.

On the other hand, since the intersection point of the signals DQS and /DQS deviates from the voltage VREF at time t14, the voltages of signals DQS and /DQS are both lower than the voltage VREF in a period from time t14m to time t14p, in the vicinity of time t14. With this, the ON resistances of the transistors Tr51 and Tr52 are larger than the on-resistances of the transistors Tr45 to Tr48. In this case, the current flowing through the current source I6 is dominated by the current flowing through the current path through the transistors Tr45 to Tr48. For that reason, in a case that is, a period from time t14m to time t14p) where the voltages of signals DQS and /DQS are both lower than the voltage VREF, similarly as in the case described in FIGS. 20A and 20B, the ability of the comparator COMP2 to cause the node N18 to go to the "H" level can be increased.

6.3 Effect According to Sixth Embodiment

According to the sixth embodiment, the comparator COMP2 includes transistors Tr49 to Tr52 that align the operation of the correction circuit with the voltage VREF reference. In a case where one of the voltages of signals DQS and /DQS is smaller than the voltage VREF, the transistors Tr49 and Tr50 dominantly supply current to the current source I5. On the other hand, in a case where the voltages of signals DQS and /DQS are both larger than the voltage VREF, the transistors Tr49 and Tr50 supply almost no current to the current source I5. With this, the transistors Tr41 to Tr44 can reduce the delay amount of the signal Sig1 generated due to the matters that the intersection of the signals DQS and /DQS deviates from the voltage VREF, only in a case where the voltages of signals DQS and /DQS are larger than the voltage VREF.

The transistors Tr51 and Tr52 dominantly supply current to the current source I6 in a case where one of the voltages of signals DQS and /DQS is larger than the voltage VREF. On the other hand, the transistors Tr51 and Tr52 supply almost no current to the current source I6 in a case where the voltages of signals DQS and /DQS are both lower than the voltage VREF. With this, the transistors Tr45 to Tr48 can reduce the delay amount of the signal Sig1 generated due to the matters that the intersection of the signals DQS and /DQS deviates from the voltage VREF, only in a case where the voltages of signals DQS and /DQS are smaller than the voltage VREF.

Accordingly, even in a case where the thresholds of the transistors Tr41 to Tr48 are deviated from the voltage VREF, the delay amount of the signal Sig1 can be corrected according to magnitude of the deviation between the intersection point of the signals DQS and /DQS and the voltage VREF.

7. Seventh Embodiment

Next, a seventh embodiment will be described. The seventh embodiment is different from the sixth embodiment in that a correction capability can be reduced in a case where the correction capability by a correction circuit becomes excessive.

In the following description, description of portions equivalent to the configuration and operation of the sixth embodiment will be omitted, and portions different from the configuration and operation of the sixth embodiment will mainly be described.

7.1 Details of Configuration of Input Circuit

Figure 23:
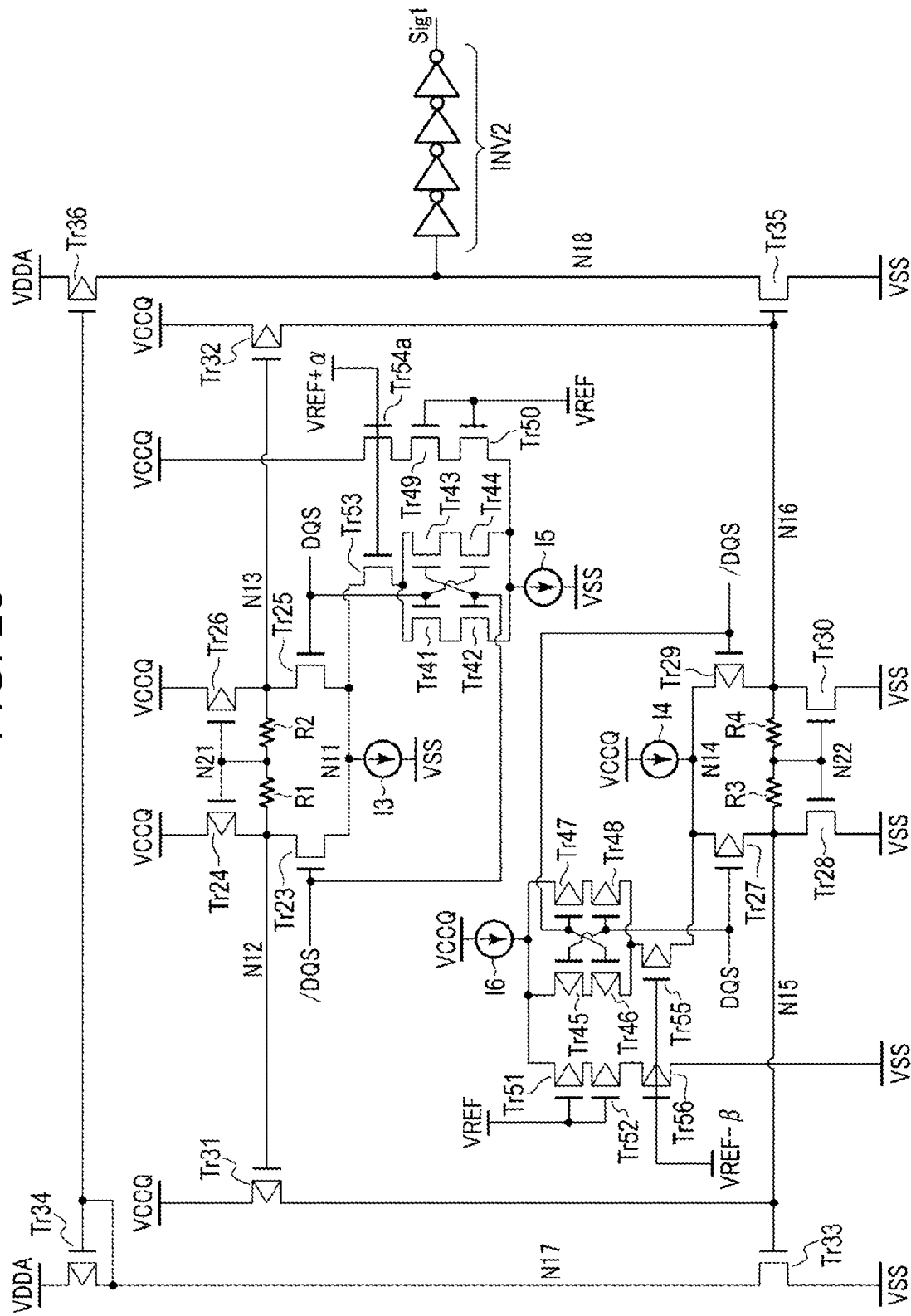
FIG. 23 is a circuit diagram of an input circuit for a strobe signal of a semiconductor memory device according to a seventh embodiment.

FIG. 23 is a circuit diagram for explaining a configuration of an input circuit of the strobe signals DQS and /DQS according to a seventh embodiment. FIG. 23 corresponds to FIG. 21 described in the sixth embodiment.

As illustrated in FIG. 23, the comparator COMP2 further includes transistors Tr53, Tr54, Tr55, and Tr56. The transistors Tr53 and Tr54 are, for example, N-type transistors, and the transistors Tr55 and Tr56 are, for example, P-type transistors.

The transistor Tr53 includes a first terminal connected to the node N11, a second terminal commonly connected to the first terminal of the transistor Tr41 and the first terminal of the transistor Tr43, and a gate to which a voltage (VREF+α) is supplied (α is a real number such that 0<α<VREF, for example). The transistor Tr54 includes a first terminal to which the voltage VCCQ is supplied, a second terminal connected to the first terminal of the transistor Tr49, and a gate to which a voltage (VREF+α) is supplied.

The transistor Tr55 includes a first terminal commonly connected to the second terminal of the transistor Tr46 and a second terminal of the transistor Tr48, a second terminal connected to the node N14, a gate to which a voltage (VREF−β) is supplied (β is a real number such that 0<β<VREF, for example). The transistor Tr56 includes a first terminal connected to a second terminal of the transistor Tr52, a second terminal to which the voltage VSS is supplied, and a gate to which the voltage (VREF−β) is supplied.

With the configuration as described above, it is possible to correct the timing deviation of the edge of the signal Sig1 while reducing excessive correction capability of the correction circuit.

7.2 Operation of Input Circuit

Figure 24:
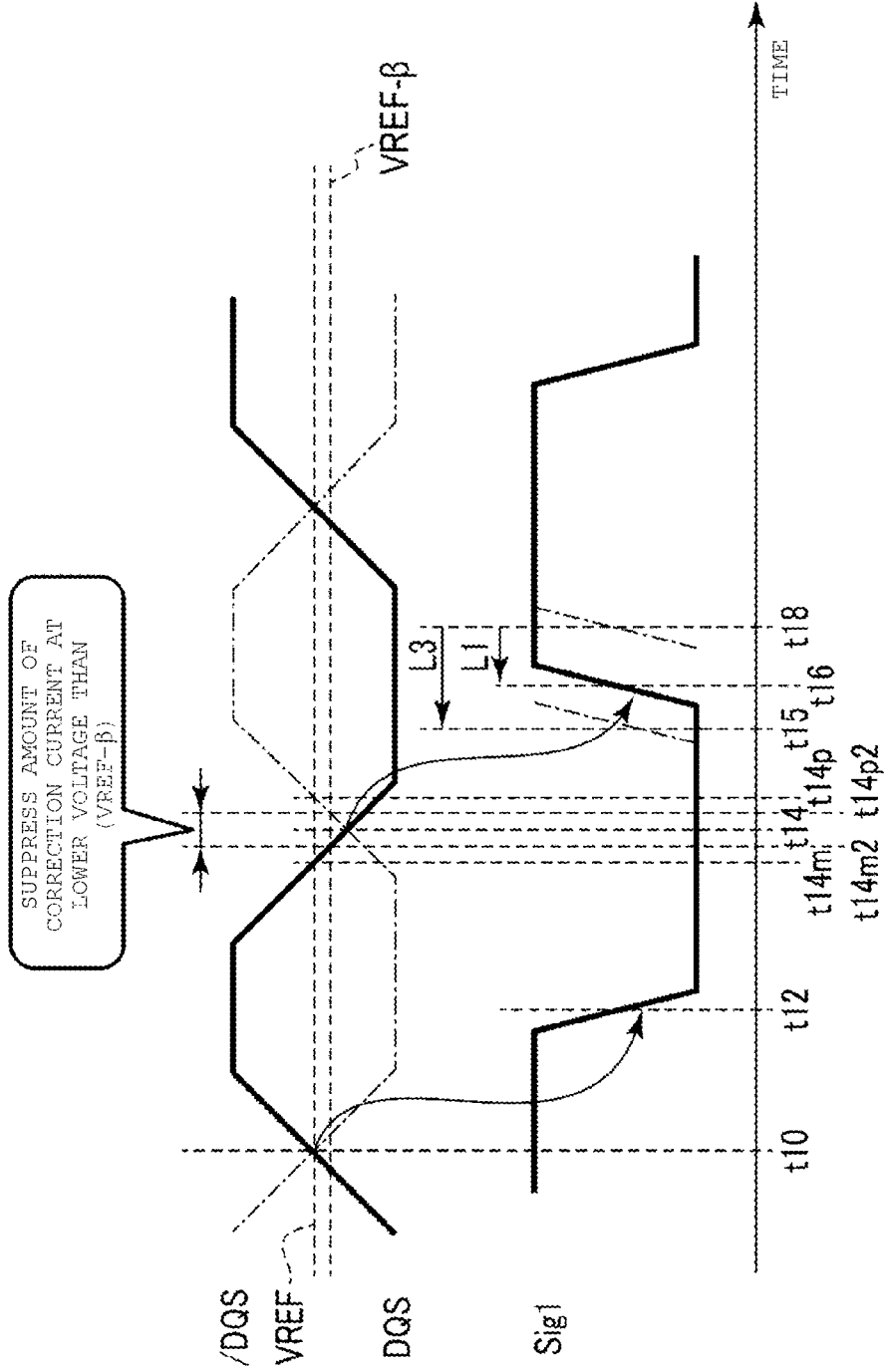
FIG. 24 is a timing chart for explaining an input operation in the semiconductor memory device according to the seventh embodiment.

FIG. 24 is a timing chart for explaining the operation of an input circuit of a semiconductor memory device according to a seventh embodiment. FIG. 24 illustrates a case where correction capabilities of the transistors Tr41 to Tr48 are reduced by the transistors Tr53 to Tr56.

As illustrated in FIG. 24, in the vicinity of time t14, a current path from current source I6 to the node N14 is formed during a period from time t14m to time t14p. However, in a case where amplitudes of the signals DQS and /DQS are large, excess current can flow through the transistors Tr45 to Tr48. With this, during the period from time t14*m* to time t14*p*, the comparator COMP2 excessively increases the ability to cause the node N18 to go to the "H" level and the delay time until the signal Sig1 rises is advanced by a period L3 which is longer than a period L1. For that reason, the signal Sig1 can rise at time t15 that is earlier than the appropriate rise timing, time t16. The comparator COMP2 can prevent the advance of the rising edge.

The voltage (VREF−β) is supplied to the gates of the transistors Tr55 and Tr56. With this, the current flowing through the transistors Tr55 and Tr56 are clamped by the transistors Tr55 and Tr56 even in a case where the voltages of signals DQS and /DQS are both lower than the voltage (VREF−β). For that reason, even in the case where the transistors Tr45 to Tr48 are turned ON by a voltage smaller than the voltage (VREF−β), the amount of current flowing through the transistors Tr45 to Tr48 is reduced to an amount of current which is in the ON state due to the voltage (VREF−β).

In the example of FIG. 24, the falling edge of the signal DQS crosses the voltage (VREF−β) at time t14*m*2 after time t14*m* and before time t14. Further, the rising edge of the signal /DQS crosses the voltage (VREF−β) at time t14*p*2 after time t14 and before time t14*p*. That is, during a period from time t14*m*2 to time t14*p*2, the voltages of signals DQS and /DQS are both lower than the voltage (VREF−β), and the amount of current flowing through the transistors Tr45 to Tr48 is reduced. For that reason, the ability of the comparator COMP2 to cause the node N18 to go to the "H" level is reduced, and the delay time until the signal Sig1 rises can be advanced by the period L1. Accordingly, the comparator COMP2 can output the signal Sig1 which rises at time t16 which is the appropriate rise timing.

7.3 Effect According to Seventh Embodiment

According to the seventh embodiment, the comparator COMP2 includes transistors Tr53 to Tr56 capable of reducing the amount of current flowing through the correction circuit. The transistors Tr53 and Tr54 clamp the amount of current flowing from the node N11 to the current source I5 in a case where the voltages of signals DQS and /DQS both become larger than the voltage (VREF+α). With this, it is possible to prevent excessive charging and discharging of electric charges to and from the node N12 or N13. Further, the transistors Tr55 and Tr56 clamp the amount of current flowing from the current source I6 to the node N14 in a case where the voltages of signals DQS and /DQS become lower than the voltage (VREF−β). With this, it is possible to prevent excessive charging and discharging of charged to the node N15 or N16. For that reason, it is possible to prevent the delay amount from being excessively reduced in a case of correcting the delay amount of the signal Sig1 generated due to deviation of the intersection point of the signals DQS and /DQS from the voltage VREF.

7.4 Modification Example

In the seventh embodiment, although the case where the transistor Tr53 is connected between the transistors Tr41 to Tr44 and the node N11 and the transistor Tr54 is connected between the transistor Tr49 and the voltage VCCQ is described, but the present disclosure is not limited thereto. In the seventh embodiment, the case where the transistor Tr55 is connected between the transistors Tr45 to Tr48 and the node N14 and the transistor Tr56 is connected between the transistor Tr52 and the voltage VSS is described, but the present disclosure is not limited thereto this.

Figure 25:
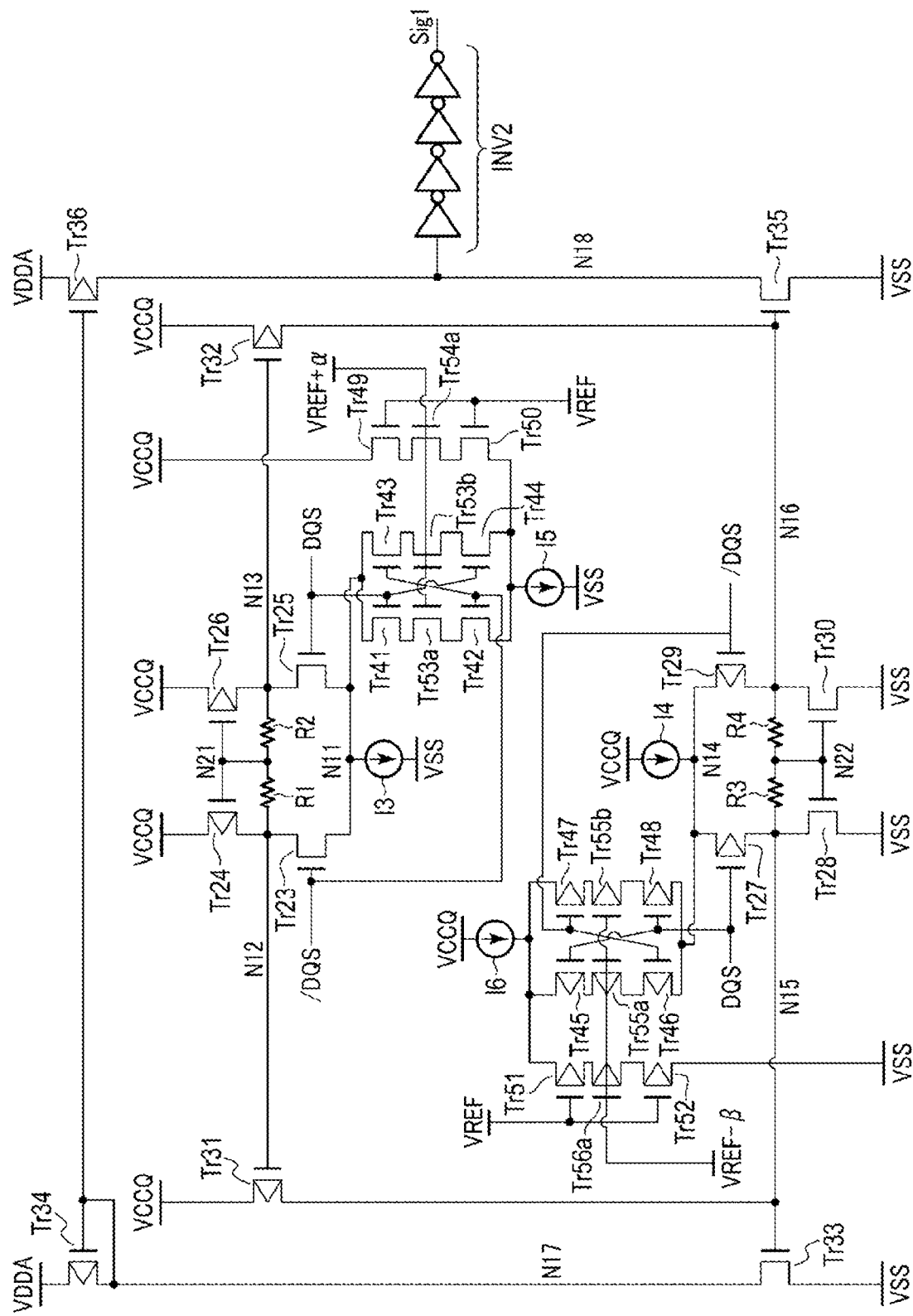
FIG. 25 is a circuit diagram of an input circuit for a strobe signal of a semiconductor memory device according to a modification example of the seventh embodiment.

FIG. 25 is a circuit diagram for explaining a configuration of an input circuit for strobe signals DQS and /DQS according to a modification example of the seventh embodiment. FIG. 25 corresponds to FIG. 23 described in the seventh embodiment.

As illustrated in FIG. 25, the comparator COMP2 may include transistors Tr53*a*, Tr53*b*, Tr54*a*, Tr55*a*, Tr55*b*, and Tr56*a*, instead of the transistors Tr53 to Tr56. The transistors Tr53*a*, Tr53*b*, and Tr54*a* are, for example, N-type transistors, and the transistors Tr55*a*, Tr55*b*, and Tr56*a* are, for example, P-type transistors.

The transistor Tr53*a* is connected in series between the transistor Tr41 and the transistor Tr42 and includes a gate to which a voltage (VREF+α) is supplied. The transistor Tr53*b* is connected in series between the transistor Tr43 and the transistor Tr44 and includes a gate to which the voltage (VREF+α) is supplied. The transistor Tr54*a* is connected in series between the transistor Tr49 and the transistor Tr50 and includes a gate to which the voltage (VREF+α) is supplied.

The transistor Tr55*a* is connected in series between the transistor Tr45 and the transistor Tr46 and includes a gate to which a voltage (VREF−β) is supplied. The transistor Tr55*b* is connected in series between the transistor Tr47 and the transistor Tr48 and includes a gate to which the voltage (VREF−β) is supplied. The transistor Tr56*a* is connected in series between the transistor Tr51 and the transistor Tr52 and includes a gate to which the voltage (VREF−β) is supplied.

With the configuration as described above, the potential between the transistors Tr41 and Tr42, the potential between the transistors Tr43 and Tr44, the potential between the transistors Tr45 and Tr46, the potential between the transistors Tr47 and Tr48, the potential between the transistors Tr49 and Tr50, and the potential between the transistors Tr51 and Tr52 are determined. For that reason, when each of the potentials becomes floating, it is possible to stabilize the operation when the signals DQ and /DQS are supplied to the correction circuit for the first time.

8. Eighth Embodiment

Next, an eighth embodiment will be described. In the seventh embodiment, the case where the correction capability is reduced by reducing the amount of current flowing in the correction circuit is described. The eighth embodiment is different from the seventh embodiment in that the correction capability is reduced by reducing amplitude of the signal to be supplied into the correction circuit.

In the following description, explanation of portions equivalent to the configuration and operation of the sixth embodiment will be omitted, and portions different from the configuration and operation of the sixth embodiment will mainly be described.

8.1 Details of Configuration of Input Circuit

Figure 26:
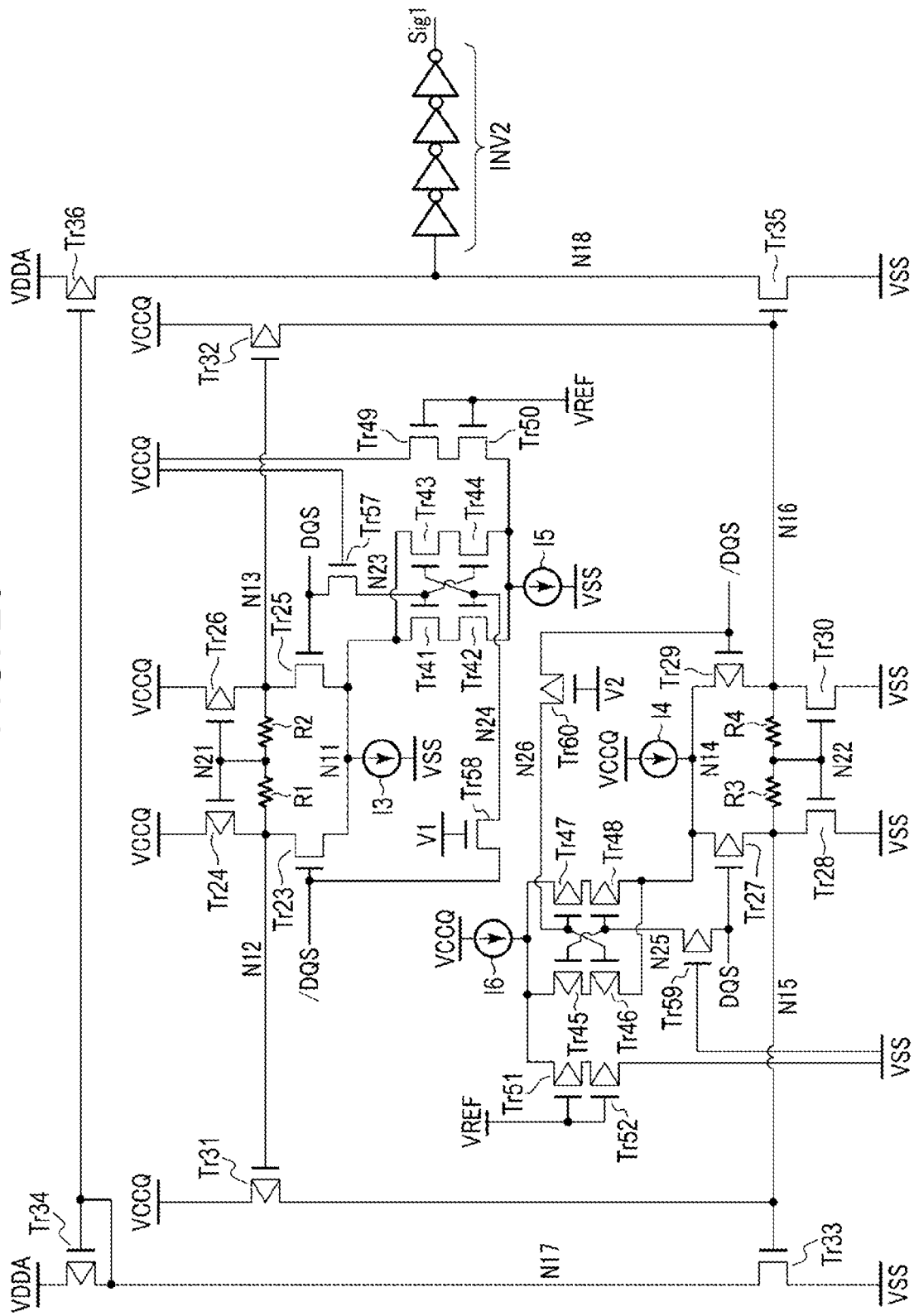
FIG. 26 is a circuit diagram of an input circuit for a strobe signal of a semiconductor memory device according to an eighth embodiment.

FIG. 26 is a circuit diagram for explaining a configuration of an input circuit of strobe signals DQS and /DQS according to an eighth embodiment. FIG. 26 corresponds to FIG. 21 described in the sixth embodiment.

As illustrated in FIG. 26, the comparator COMP2 further includes transistors Tr57, Tr58, Tr59, and Tr60. The transistors Tr57 and Tr58 are, for example, N-type transistors, and the transistors Tr59 and Tr60 are, for example, P-type transistors.

The transistor Tr57 includes a first terminal to which the signal DQS is supplied, a second terminal connected to a node N23, and a gate to which a voltage V1 is supplied. The transistor Tr58 includes a first terminal to which the signal /DQS is supplied, a second terminal connected to a node N24, and a gate to which the voltage V1 is supplied. The node N23 is a node commonly connected to the gate of the transistor Tr41 and the gate of the transistor Tr44. The node N24 is a node commonly connected to the gate of the transistor Tr42 and the gate of the transistor Tr43. The Voltage V1 is a voltage at which the transistors Tr57 and Tr58 can be turned ON to such an extent that amplitudes of signals DQ and /DQS can be clamped.

The transistor Tr59 includes a first terminal connected to a node N25, a second terminal to which the signal DQS is supplied, and a gate to which a voltage V2 is supplied. The transistor Tr59 includes a first terminal connected to a node N26, a second terminal to which the signal /DQS is supplied, and a gate to which the voltage V2 is supplied. The node N25 is a node commonly connected to the gate of the transistor Tr45 and the gate of the transistor Tr48. The node N26 is a node commonly connected to the gate of the transistor Tr46 and the gate of the transistor Tr47. The voltage V2 is a voltage at which the transistors Tr59 and Tr60 can be turned ON to such an extent that amplitudes of signals DQ and /DQS can be clamped.

With the configuration as described above, it is possible to correct the timing deviation of the edge of the signal Sig1 while reducing excessive correction capability of the correction circuit.

8.2 Operation of Input Circuit

FIG. 27 is a timing chart for explaining the operation of an input circuit of a semiconductor memory device according to an eighth embodiment. FIG. 27 illustrates a case where the correction capabilities of the transistors Tr41 to Tr48 are reduced by the transistors Tr57 to Tr60.

As illustrated in FIG. 27, in the vicinity of time t14, a current path from the current source I6 to the node N14 is formed during a period from time t14m to time t14p. However, in a case where the amplitudes of the signals DQS and /DQS are large, excessive current can flow through the transistors Tr45 to Tr48. With this, during the period from time t14m to time t14p, the comparator COMP2 excessively increases the ability to cause the node N18 to go to the "H" level, and the delay time until the signal Sig1 rises is advanced by the period L3. For that reason, the signal Sig1 can rise at time t15 that is earlier than time t16 which is the appropriate rise timing. The comparator COMP2 can prevent the advance of the rising edge.

The voltage V2 is supplied to the gates of the transistors Tr59 and Tr60. With this, the amplitude of the signal DQS supplied from the transistor Tr59 to the node N25 and the amplitude of the signal /DQS supplied from the transistor Tr60 to the node N26 are clamped by the voltage V2. For that reason, the on-resistances of the transistors Tr45 to Tr48 are increased and the amount of current flowing through the transistors Tr45 to Tr48 is reduced.

In the example of FIG. 27, rising of the signal /DQS starts at time t14m3 after time t14m and before time t14. Falling of the signal DQS ends at time t14p3 after time t14 and before time t14p. That is, during a period from time t14m and time t14m3, the on-resistances of the transistors Tr46 and Tr47 increase and the amount of current flowing through the transistors Tr46 and Tr47 is reduced. In addition, between time t14p3 and time t14p, the on-resistances of the transistors Tr45 and Tr48 increase, and the amount of current flowing through the transistors Tr45 and Tr48 is reduced. For that reason, the ability of the comparator COMP2 to cause the node N18 to go to the "H" level is reduced and the delay time until the signal Sig1 rises is advanced by the period L1. Accordingly, the comparator COMP2 can output the signal Sig1 which rises at time t16 which is the appropriate rise timing.

8.3 Effect According to Eighth Embodiment

According to the eighth embodiment, the comparator COMP2 includes transistors Tr57 to Tr60 capable of reducing amplitude of the signal to be supplied to the correction circuit. The transistors Tr57 and Tr58 clamp amplitudes of the signals to be supplied to the nodes N23 and N24 in a case where the amplitudes of the signals DQS and /DQS are large. With this, it is possible to prevent excessive charging and discharging of electric charges to and from the node N12 or N13. The transistors Tr59 and Tr60 clamp the amplitudes of the signals to be supplied to the nodes N25 and N26 in a case where the amplitudes of the signals DQS and /DQS are large. With this, it is possible to prevent excessive charging and discharging of electric charges to and from the node N15 or N16. For that reason, it is possible to prevent the delay amount from being excessively reduced in a case of correcting the delay amount of the signal Sig1 generated due to deviation of the intersection point of the signals DQS and /DQS from the voltage VREF.

9. Others

In addition, the following modifications can be appropriately made to the embodiments.

For example, in the first embodiment and the second embodiment described above, the case where the duty ratio of the signals Sig1 and Sig2 is made different from that of the signals DQS and /DQS by changing the size of the transistors in the comparator COMP2 is described, but the present disclosure is not limited thereto. In the first embodiment and the second embodiment described above, any configuration in which the pull-down capability and the pull-up capability of the nodes N18 and N20 can be different from each other can be adopted. For example, a current source capable of supplying further current is connected to the node N15 or N16 so as to make it possible to achieve the same effects as those of the first embodiment and the second embodiment.

In the modification example of the second embodiment described above, the case where the delay amounts of the inverter groups INV2-1, INV3-1, INV2-2, and INV3-2 are adjusted in order to adjust the timing of the edges of the signals Sig1-1, Sig2-1, Sig1-2, and Sig2-2 is described, but the present disclosure is not limited thereto. In the modification example of the second embodiment, any configuration in which the timing of the edges of the signals Sig1-1, Sig2-1, Sig1-2, and Sig2-2 can be adjusted can be adopted. For example, in the modification example of the second embodiment, the duty ratio of the signals Sig1 and Sig2 may be changed by dynamically adjusting the size of the transistors (for example, transistors Tr35 and Tr39) in the comparator COMP2 to finally adjust the timings of the edges of the signals Sig1-1, Sig2-1, Sig1-2, and Sig2-2.

Further, in the third embodiment described above, the case where the nodes n1 and n3 and the nodes n2 and n4 are connected via the inverters INVg to INVj in the input circuit 221 is described, but the present disclosure is not limited thereto. For example, the input circuit 221 may be configured in such a way that the nodes n1 and n4 and the nodes n2 and n3 are directly connected without using inverters. For example, the input circuit 221 can achieve the same effect by connecting the comparators COMP1-1 and COMP1-2 without using the inverters INVg to INVj in the input circuit 221. Specifically, for example, by connecting the node N7 of the comparator COMP1-1 and the node N7 of the comparator COMP1-2 and connecting the node N8 of the comparator COMP1-1 and the node N8 of the comparator COMP1-2 are connected, it is possible to bring the duty ratio of the signal Din close to 50%. The modifications described for the third embodiment can be similarly applied to the input circuit 223 of the fourth embodiment.

In addition, in the fifth to eighth embodiments described above, the case where the signals DQS and /DQS are input is described, but the present disclosure is not limited thereto. For example, the fifth to eighth embodiments described above can be applied to any signal pairs (for example, signals RE and /RE) having complementary relationship to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array including a plurality of memory cells each configured to store data;
   an input circuit that includes:
      a first comparator configured to output a first output signal based on a comparison result of a first input signal and a first reference signal,
      a second comparator configured to output a second output signal based on a comparison result between a second input signal and a second reference signal,
      a third comparator configured to output a third output signal based on a comparison result between a third input signal and a third reference signal,
      an inverter connected between an output node of the second comparator and an output node of the third comparator, and
      a data latch circuit configured to latch the first output signal using the second output signal or the third output signal; and
   a control circuit configured to switch the inverter on and off,
   wherein a duty ratio of the first output signal and a duty ratio of the second output signal are different from a duty ratio of the first input signal and a duty ratio of the second input signal, respectively, and
   wherein the inverter includes a tri-state inverter, and the control circuit is configured to output a control signal to the tri-state inverter.

2. The semiconductor memory device according to claim 1, wherein a duty ratio of the second output signal and a duty ratio of the third output signal are greater or less than a duty ratio of the second input signal and a duty ratio of the third input signal, respectively.

3. The semiconductor memory device according to claim 1, wherein the first, second and third reference signals have the same voltage level.

4. The semiconductor device according to claim 1, wherein the input circuit further includes:
   a plurality of first inverters through which the first output signal is transmitted toward the data latch circuit, thereby adding a first delay to the first output signal,
   a plurality of second inverters through which the second output signal is transmitted toward the data latch circuit, thereby adding a second delay to the second output signal, and
   a plurality of third inverters through which the third output signal is transmitted toward the data latch circuit, thereby adding a third delay to the third output signal.

5. The semiconductor device according to claim 4, wherein
   the tri state inverter cross-connects n-th stages of the second inverters and the third inverters, n being a positive integer, and
   the control circuit is configured to output a control signal to the tri-state inverter.

6. The semiconductor device according to claim 5, wherein
   the inverter further includes another tri-state inverter that cross-connects (n+1)-th stages of the second inverters and the third inverters, and
   the control circuit is configured to output the control signal to the another tri-state inverter.

7. The semiconductor device according to claim 6, further comprising:
   a dummy load that is applied to the first inverters to increase the first delay.

8. The semiconductor device according to claim 1, wherein the data latch circuit includes a first data latch configured to latch the first output signal using the second output signal at a first timing, and a second data latch configured to latch the first output signal using the third output signal at a second timing after the first timing.

9. A semiconductor memory device, comprising:
   a memory cell array including a plurality of memory cells each configured to store data;
   an input circuit that includes:
      a first comparator configured to output a first output signal based on a comparison result of a first input signal and a first reference signal,
      a second comparator configured to output a second output signal based on a comparison result between a second input signal and a second reference signal,
      a third comparator configured to output a third output signal based on a comparison result between a third input signal and a third reference signal,
      an inverter connected between an output node of the second comparator and an output node of the third comparator, and
      a data latch circuit configured to latch the first output signal using the second output signal or the third output signal; and
   a control circuit configured to switch the inverter on and off,
   wherein a duty ratio of the first output signal and a duty ratio of the second output signal are different from a duty ratio of the first input signal and a duty ratio of the second input signal, respectively, and
   wherein the first comparator includes:
      an amplification circuit that includes a first transistor having a gate to which the first input signal is supplied, a second transistor having a gate to which the first reference signal is supplied, and a first current source having an output terminal commonly connected to a first terminal of each of the first transistor and the second transistor via a first node, a first current mirror circuit that includes a first terminal connected to a second terminal of the first transistor, a second current mirror circuit that includes a first terminal connected to a second terminal of the second transistor, and a third current mirror circuit that includes a first terminal connected to a second terminal of the first current mirror circuit and a second terminal connected a second terminal of the second current mirror circuit.

10. The semiconductor device according to claim 9, wherein the first current mirror circuit includes a third transistor and a fourth transistor, and a first terminal and a gate of the third transistor and a gate of the fourth transistor are connected to the second terminal of the first transistor, the second current mirror circuit includes a fifth transistor and a sixth transistor, and a first terminal and a gate of the fifth transistor and a gate of the sixth transistor are connected to the second terminal of the second transistor, and the third current mirror circuit includes a seventh transistor and an eighth transistor, and a first terminal and a gate of the seventh transistor and a gate of the eighth transistor are connected to a first terminal of the fourth transistor, and a first terminal of the eighth transistor is connected to a first terminal of the sixth transistor.

11. The semiconductor device according to claim 10, wherein each of the second and third comparators has a same configuration as the first comparator.

* * * * *

UNITED STATES PATENT AND TRADEMARK OFFICE
CERTIFICATE OF CORRECTION

| | | |
|---|---|---|
| PATENT NO. | : 11,211,130 B2 | Page 1 of 1 |
| APPLICATION NO. | : 16/867263 | |
| DATED | : December 28, 2021 | |
| INVENTOR(S) | : Yasuhiro Hirashima et al. | |

It is certified that error appears in the above-identified patent and that said Letters Patent is hereby corrected as shown below:

In the Claims

Column 39, Line 12, insert --to-- after "connected".

Signed and Sealed this
Fifteenth Day of November, 2022

Katherine Kelly Vidal
*Director of the United States Patent and Trademark Office*